(12) United States Patent
Wang et al.

(10) Patent No.: US 11,295,930 B2
(45) Date of Patent: Apr. 5, 2022

(54) METHOD AND APPARATUS FOR CHARGED PARTICLE DETECTION

(71) Applicant: ASML Netherlands B.V., Veldhoven (NL)

(72) Inventors: Yongxin Wang, San Ramon, CA (US); Weiming Ren, San Jose, CA (US); Zhonghua Dong, Sunnyvale, CA (US); Zhongwei Chen, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 50 days.

(21) Appl. No.: 16/484,106

(22) PCT Filed: Feb. 1, 2018

(86) PCT No.: PCT/EP2018/052480
§ 371 (c)(1),
(2) Date: Aug. 6, 2019

(87) PCT Pub. No.: WO2018/145983
PCT Pub. Date: Aug. 16, 2018

(65) Prior Publication Data
US 2020/0027694 A1 Jan. 23, 2020

Related U.S. Application Data

(60) Provisional application No. 62/455,674, filed on Feb. 7, 2017, provisional application No. 62/577,129, filed on Oct. 25, 2017.

(51) Int. Cl.
*H01J 37/244* (2006.01)
*H01J 37/28* (2006.01)
*G01N 23/2251* (2018.01)

(52) U.S. Cl.
CPC ........ *H01J 37/244* (2013.01); *G01N 23/2251* (2013.01); *H01J 37/28* (2013.01);
(Continued)

(58) Field of Classification Search
CPC ........ G01N 23/04; G01N 23/20; G01N 23/00; H01J 37/244; H01J 37/256; H01J 37/28;
(Continued)

(56) References Cited

U.S. PATENT DOCUMENTS

| 5,384,463 A | 1/1995 | Honjo et al. |
| 7,038,185 B1 | 5/2006 | Tumblin et al. |

(Continued)

FOREIGN PATENT DOCUMENTS

| CN | 102436650 A | 5/2012 |
| EP | 0418949 A1 | 3/1991 |

(Continued)

OTHER PUBLICATIONS

Office Action and Search Report issued from the Intellectual Property Office of ROC Taiwan Patent Application No. 107104233, dated Nov. 12, 2018 (14 pages).

(Continued)

*Primary Examiner* — David A Vanore
(74) *Attorney, Agent, or Firm* — Finnegan, Henderson, Farabow, Garrett & Dunner, LLP

(57) ABSTRACT

Systems and methods are provided for charged particle detection. The detection system can comprise a signal processing circuit configured to generate a set of intensity gradients based on electron intensity data received from a plurality of electron sensing elements. The detection system can further comprise a beam spot processing module configured to determine, based on the set of intensity gradients, at least one boundary of a beam spot; and determine, based on the at least one boundary, that a first set of electron (Continued)

sensing elements of the plurality of electron sensing elements is within the beam spot. The beam spot processing module can further be configured to determine an intensity value of the beam spot based on the electron intensity data received from the first set of electron sensing elements and also generate an image of a wafer based on the intensity value.

15 Claims, 14 Drawing Sheets

(52) U.S. Cl.
CPC ............... *H01J 2237/24465* (2013.01); *H01J 2237/24495* (2013.01); *H01J 2237/24507* (2013.01); *H01J 2237/24578* (2013.01); *H01J 2237/24592* (2013.01); *H01J 2237/2817* (2013.01)

(58) Field of Classification Search
CPC ....... H01J 2237/057; H01J 2237/24475; H01J 2237/24485; H01J 2237/24495; H01J 2237/2522; H01J 2237/2802; H01J 2237/2804; H01J 2237/2809; H01J 37/05; H01J 37/265; H01J 2237/08; H01J 2237/20207; H01J 2237/2441; H01J 2237/2446
USPC .................................. 250/305, 311, 306, 310
See application file for complete search history.

(56) References Cited

U.S. PATENT DOCUMENTS

| | | | |
|---|---|---|---|
| 10,163,603 B2 | 12/2018 | Zeidler et al. | |
| 10,535,494 B2 | 1/2020 | Zeidler et al. | |
| 11,049,686 B2 | 6/2021 | Zeidler et al. | |
| 2002/0168787 A1 | 11/2002 | Noguchi et al. | |
| 2003/0085350 A1* | 5/2003 | Kaji | G01N 23/04 250/305 |
| 2003/0085356 A1* | 5/2003 | Kaji | H01J 37/28 250/311 |
| 2004/0075054 A1 | 4/2004 | Knippelmeyer | |
| 2008/0073582 A1* | 3/2008 | Shichi | H01J 37/3045 250/492.21 |
| 2016/0178543 A1 | 6/2016 | Schillinger et al. | |
| 2020/0335301 A1* | 10/2020 | Bammes | H04N 5/341 |
| 2021/0313137 A1 | 10/2021 | Zeidler et al. | |

FOREIGN PATENT DOCUMENTS

| | | | |
|---|---|---|---|
| EP | 2958131 A1 | 12/2015 | |
| JP | H03105575 A | 5/1991 | |
| JP | 2000021346 A | 1/2000 | |
| JP | 2004134387 A | 4/2004 | |
| JP | 2012073953 A | 4/2012 | |
| JP | 2017515283 A | 6/2017 | |
| TW | 201400993 A | 1/2014 | |
| TW | 201546861 A | 12/2015 | |
| TW | 201614383 A | 4/2016 | |
| WO | WO 2010/042629 A2 | 4/2010 | |
| WO | WO 2015/170969 A1 | 11/2015 | |
| WO | WO 2016/125864 A1 | 8/2016 | |

OTHER PUBLICATIONS

International Search Report dated May 14, 2018, for corresponding PCT International Application No. PCT/EP2018/052480 (5 pages).
English Translation of the Office Action issued by the ROC (Taiwanese) Intellectual Property Office in related International Application No. 108116286, dated Nov. 7, 2019 (15 pgs.).
Notice of Reasons for Rejection issued by the Japanese Patent Office in related Application No. 2019-539748, dated Oct. 19, 2020 (11 pgs.).
First Office Action issued in related Chinese Patent Application No. 2018800105442; dated Apr. 22, 2021 (12 pgs.).
Notification of the First Office Action from the Patent Office of the People's Republic of China issued in related Chinese Patent Application No. 2018800105442; dated Apr. 22, 2021 (2 pgs.).
Search Report issued in related Chinese Patent Application No. 2018800105442; dated Apr. 13, 2021 (2 pgs.).

* cited by examiner

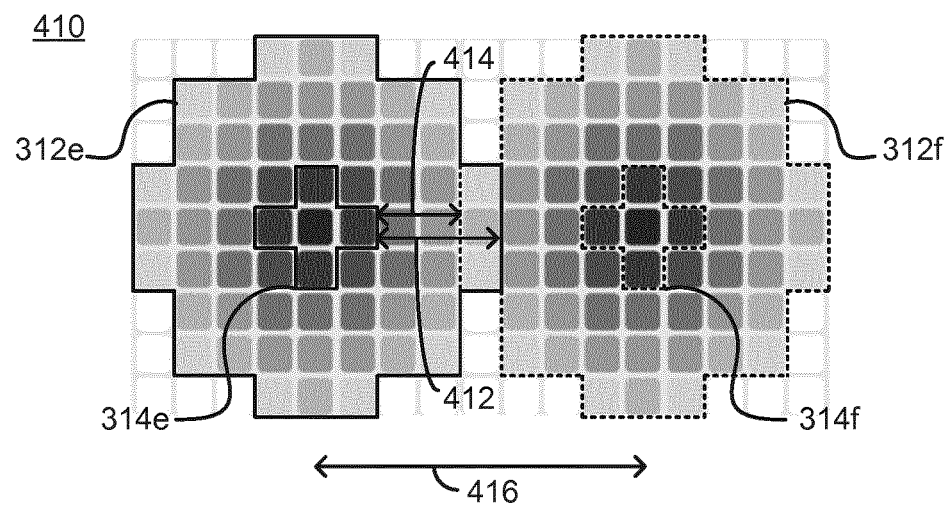
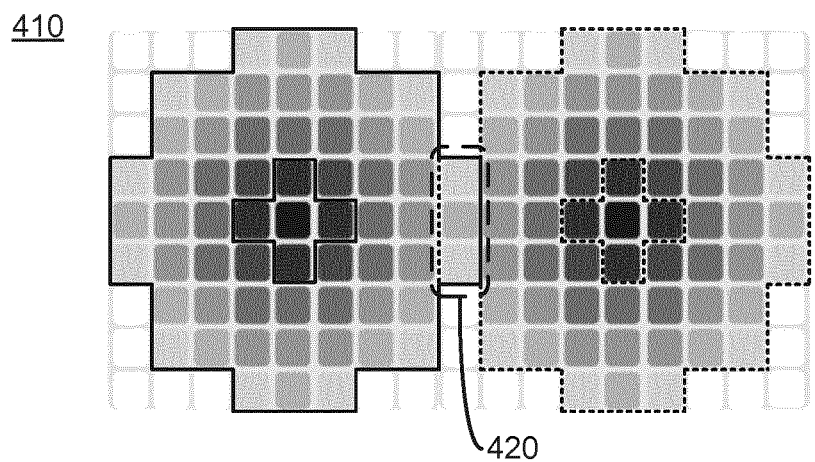
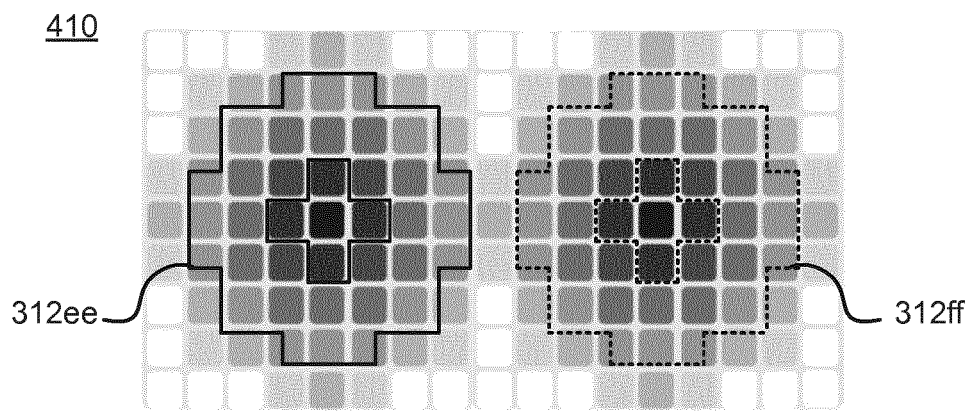
FIG. 4B

METHOD AND APPARATUS FOR CHARGED PARTICLE DETECTION

CROSS REFERENCE TO RELATED APPLICATIONS

This application is a national stage filing under 35 U.S.C. § 371 of International Application No. PCT/EP2018/052480 filed on Feb. 1, 2018, and published as WO 2018/145983 A1, which is based upon and claims priority to U.S. Provisional Application No. 62/455,674, filed Feb. 7, 2017, and entitled "High Speed Electron Detection Method," and to U.S. Provisional Application No. 62/577,129 filed Oct. 25, 2017, and entitled "Method and Apparatus for Charged Particle Detection," and the disclosures of all of these applications are incorporated herein by reference in their entireties.

TECHNICAL FIELD

The present disclosure generally relates to the field of charged particle beam, and more particularly, to a method and an apparatus for charged particle detection.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With an SEM, electrons of a single primary electron beam, or electrons of a plurality of primary electron beams, can be focused at predetermined scan locations of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and/or external structures of the wafer.

The electron beams comprising the backscattered electrons and the secondary electrons can form one or more beam spots at predetermined locations on a surface of an electron detector. The electron detector can generate electrical signals (e.g., a current, a voltage, etc.) that represent an intensity of the detected electron beams. The electrical signals can be measured with measurement circuitries (e.g., analog-to-digital converters) to obtain a distribution of the detected electrons. The electron distribution data collected during a detection time window, in combination with corresponding scan path data of the one or more primary electron beams incident on the wafer surface, can be used to reconstruct images of the wafer structures under inspection. The reconstructed images can be used to reveal various features of the internal and/or external structures of the wafer, and can be used to reveal any defects that may exist in the wafer.

The fidelity of the image reconstruction determines how closely the images represent the wafer structures. The fidelity can be degraded by noise signals that are not associated with the primary electrons or the secondary electrons emitted by the wafer. There are various potential sources of noise signals. For example, the electron detector may generate dark currents with or without receiving any electrons. The dark currents may be added to the currents that are actually commensurate with the detected electrons, thereby introducing error data to the image reconstruction. Moreover, the electron detector may also generate no current, or an amount of current that does not reflect the number of electrons received, due to malfunction. Further, in a case with multiple primary electron beams scanning the wafer and where multiple electron beams are emitted by the wafer under inspection, due to the effects of aberration and dispersion in the electron optical sub-system, electrons from adjacent beams emitted from the wafer can reach the same location of the electron detector surface. As a result, beam spots formed by adjacent electron beams may overlap partially, leading to crosstalk. All of these can be added to the output signals of the electron detector as noise components. As a result, the output signals of the electron detector may include noise components that do not correlate with a particular wafer structure under inspection, and the fidelity of the image reconstruction based on these output signals can be degraded as a result.

SUMMARY

Embodiments of the present disclosure provide systems and methods for charged particle detection. In one embodiment, a detection system is provided. The detection system comprises a signal processing circuit configured to generate a set of intensity gradients based on electron intensity data received from a plurality of electron sensing elements. The detection system further comprises a beam spot processing module configured to determine, based on the set of intensity gradients, at least one boundary of a beam spot; and determine, based on the at least one boundary, that a first set of electron sensing elements of the plurality of electron sensing elements is within the beam spot.

In another embodiment, a detection system is provided. The detections system comprises a beam spot processing module. The beam spot processing module is configured to acquire a set of intensity gradients generated based on gradients in the intensity signals between adjacent electron sensing elements of a plurality of electron sensing elements. The beam spot processing module is also configured to determine, based on the set of intensity gradients, at least one boundary of a beam spot. The beam spot processing module is further configured to determine, based on the at least one boundary, that a first set of electron sensing elements of the plurality of electron sensing elements is within the beam spot.

In another embodiment, a detection system is provided. The detection system comprises a signal processing circuit configured to generate a set of intensity gradients based on electron intensity data received from a plurality of electron sensing elements. The detection system further comprises a beam spot processing module configured to determine, based on the set of intensity gradients, a first boundary of a first beam spot and a second boundary of a second beam spot. The beam spot processing module is also configured to determine, based on the first boundary, that a first set of electron sensing elements of the plurality of electron sensing elements is within the first beam spot and determine, based on the second boundary, that a second set of electron sensing elements of the plurality of electron sensing elements is within the second beam spot. The beam spot processing module is further configured to determine, based on the first and second boundary, an overlapping region between the first beam spot and the second beam spot.

In another embodiment, a detection system is provided. The detection system comprises a beam spot processing module configured to acquire a set of intensity gradients generated based on gradients in the intensity signals between adjacent electron sensing elements of a plurality of electron sensing elements. The beam spot processing module is also configured to determine, based on the set of intensity gradients, a first boundary of a first beam spot and a second boundary of a second beam spot. The beam spot processing module is further configured to determine, based on the first boundary, that a first set of electron sensing elements of the plurality of electron sensing elements is within the first beam spot and determine, based on the second boundary, that a second set of electron sensing elements of the plurality of electron sensing elements is within the second beam spot. The beam spot processing module is also configured to determine, based on the first and second boundary, an overlapping region between the first beam spot and the second beam spot.

In another embodiment, an electron detection system is provided. The electron detection system comprises a plurality of electron sensing elements configured to receive at least one electron beam, comprising secondary or backscattered electrons, from a wafer. The electron detection system also comprises a processing system. The processing system comprises an intensity gradient determination circuit configured to determine a set of intensity gradients based on electron intensity data received from each of the plurality of electron sensing elements. The processing system also comprises a beam spot boundary determination module configured to determine, based on the set of intensity gradients, at least one boundary of a beam spot of one of the at least one received electron beam and determine based on the at least one boundary, that a first set of electron sensing elements of the plurality of electron sensing elements is within the beam spot. The processing system further comprises a beam spot intensity determination module configured to determine an intensity value of the beam spot based on the electron intensity data received from the first set of electron sensing elements. The processing system also comprises an image reconstruction module configured to generate an image of the wafer based on the intensity value.

In another embodiment, a method is provided. The method comprises determining a set of intensity gradients based on electron intensity data received from each of a plurality of electron sensing elements. The method further comprises determining, based on the set of intensity gradients, at least one boundary of a beam spot.

In another embodiment, a method is provided. The method comprises determining a set of intensity gradients based on electron intensity data received from each of a plurality of electron sensing elements. The method further comprises determining, based on the set of intensity gradients, a first boundary of a first beam spot and a second boundary of a second beam spot. The method also comprises determining, based on the first boundary, that a first set of electron sensing elements of the plurality of electron sensing elements is within the first beam spot and determining, based on the second boundary, that a second set of electron sensing elements of the plurality of electron sensing elements is within the second beam spot. The method further comprises determining, based on the first and second boundary, an overlapping region between the first beam spot and the second beam spot.

In another embodiment, a non-transitory computer readable storage medium is provided. The storage medium stores instructions that are executable by a computing device that includes one or more processors to cause the computing device to perform a method. The method comprises determining a set of intensity gradients based on electron intensity data received from each of a plurality of electron sensing elements and determining, based on the set of intensity gradients, at least one boundary of a beam spot.

In another embodiment, a non-transitory computer readable storage medium is provided. The storage medium stores instructions that are executable by a computing device that includes one or more processors to cause the computing device to perform a method. The method comprises determining a set of intensity gradients based on electron intensity data received from each of a plurality of electron sensing elements. The method further comprises determining, based on the set of intensity gradients, a first boundary of a first beam spot and a second boundary of a second beam spot. The method also comprises determining, based on the first boundary, that a first set of electron sensing elements of the plurality of electron sensing elements is within the first beam spot and determining, based on the second boundary, that a second set of electron sensing elements of the plurality of electron sensing elements is within the second beam spot. The method further comprises determining, based on the first and second boundary, an overlapping region between the first beam spot and the second beam spot.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF THE DRAWINGS

FIGS. 4A-4C are diagrams illustrating exemplary methods of reducing noise components from the determined intensity of an electron beam spot, consistent with embodiments of the present disclosure.

DESCRIPTION OF THE EMBODIMENTS

Figure 1:
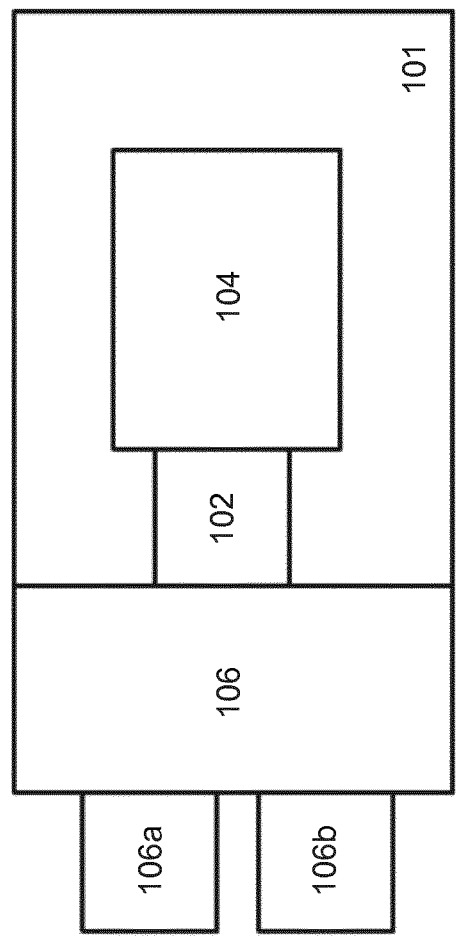
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Embodiments of the present disclosure provide an electron beam tool with an electron detector, as well as pre-processing circuitry, signal processing circuitry and post-processing circuitry coupled with the electron detector. The electron detector can be configured to receive backscattered primary electrons and secondary electrons emitted from a wafer. The received electrons form one or more beam spots on a surface of the detector. The surface can include a plurality of electron sensing elements configured to generate electrical signals in response to receiving the electrons. The pre-processing circuitry and the signal processing circuitry can be configured to generate indications related to the magnitude of the generated electrical signals. The post-processing circuitry can be configured to determine, based on the generated indications, which of the electron sensing elements lie within a primary boundary of a beam spot, and generate a value representing the intensity of the beam spot based on the determined primary boundary. With such arrangements, the disclosed embodiments can determine which of the electron sensing elements lie outside the primary boundary of the beam spot, and estimate the noise signals based on the output of those sensing elements. The post-processing circuitry can also compensate for the estimated noise signals when generating the intensity data of the beam spot. The fidelity and the speed of the wafer image reconstruction can both be improved as a result.

The post-processing circuitry can also be configured to determine a secondary boundary of a beam spot. The electrons in an incident electron beam may have different properties e.g., different energy due to different generation process. The distribution or concentration of the electrons with different properties may vary at different locations within the electron beam which forms a corresponding intensity pattern in the detected electron beam spot. The determined primary and secondary boundaries can be used to group output signals of the corresponding electron sensing elements. The groups can be formed so that their geometrical arrangement matches the pattern of the corresponding electron beam spot. As an example, portion of the electron beam spot detected by electron sensing elements within the secondary beam boundary may comprise almost entirely of backscattered electrons and a portion of the electron beam spot detected by electron sensing elements between the primary and secondary beam boundaries may comprise almost entirely of secondary electrons. The formed groups can therefore yield intensity information of the entire detected beam and also the intensity information corresponding to the backscattered and secondary electron portions of the electron beam. Accordingly, disclosed embodiments can provide additional information about the detected electron beam spots and consequently additional properties of the sample under investigation.

For a system comprising multiple detected electron beams, crosstalk in the signals from adjacent beams is caused by the effects of aberration and dispersion in the electron optical sub-system. The electrons in each beam may be dispersed on their way to the sensing surface of the electron detector causing overlap between adjacent electron beam spots. The grouping of output signals from electron sensing elements based on the determined beam boundaries can be used for detecting crosstalk between adjacent detected beams. The post-processing circuitry can also compensate for the determined cross-talk signals when generating the intensity data of the multiple beam spots. The fidelity and the speed of the wafer image reconstruction can both be improved as a result. In some embodiments, apertures within the electron optical sub-system that are used to reduce the crosstalk can be removed. This can simplify the design, manufacture and maintenance of the electron beam tool. Further, the apertures within the electron optical sub-system can cause significant intensity reduction of detected electron beams and reduce signal-to-noise ratio. The crosstalk determination and compensation provided by the disclosed embodiments can be used to adjust the balance between signal-to-noise ratio and crosstalk in real time. The ability to adjust the balance between signal-to-noise ratio and cross-talk in real time can greatly improve the flexibility and performance of the electron beam tool.

Further, the disclosed embodiments can comprise signal processing circuitry to perform the beam boundary determination and beam intensity determination in real-time. This can enable higher speed performance compared with a system using post-processing algorithms to perform the beam boundary determination and beam intensity determination functions. The high-speed real-time performance can provide information about how the electron optical sub-system is performing in real-time and any performance deviation (for example, shape and locus of each beam, geometric formation of the electron beam grids, unexpected movements of part or all of the beams due to the imperfection of components manufacturing and assembling, drift during long term operation) can be detected and addressed. Further, anti-deflection systems are used in conventional systems to cancel movements of the secondary electron beams. It is technically challenging to synchronize the anti-deflection systems with the primary electron beam deflectors. The disclosed embodiments can track the movement of the beam spots in real-time, and therefore in some embodiments, the anti-deflection system can be removed.

Further, the beam intensity determination in the disclosed embodiments can be performed by grouping signals corresponding to a large number of electron sensing elements. If one or some of the electron sensing elements of a group do not operate properly due to the contamination of the electron sensing element surface, or damage to the electron sensing elements caused by unexpected incidents (for example, severe arcing in the vacuum chamber in which the electron optical sub-system is housed), or malfunction of the electron sensing elements resulting from defects introduced in the manufacture process, the group can still achieve the beam intensity determination function by excluding the non-working electron sensing elements from the group. This can improve the reliability and failure tolerance of the detection system.

In some embodiments, the signal processing circuitry and the post-processing circuitry can also be configured to scan the electronic signals corresponding to the electron sensing elements and generate an image of the one or more electron beam spots imposed on the detector surface. The scan rate can be configured to generate this image at a frame rate lower than the update rate of the groups used to determine beam intensities. However, this image can provide detailed information about the electron beam spot intensity distribution on the detector surface and is useful in designing, optimizing, and conducting performance evaluation of the electron optics system. Further, the generated image and the determined beam boundaries can be used to detect any deviations in the shape or loci of one more detected electron beams caused due to drift during long term operation of the system and can be used to compensate for these effects.

Reference will now be made in detail to the example embodiments, which are illustrated in the accompanying drawings. Although the following embodiments are described in the context of utilizing electron beams, the disclosure is not so limited. Other types of charged particle beams can be similarly applied.

Reference is now made to FIG. 1, which illustrates an exemplary electron beam inspection (EBI) system 100 consistent with embodiments of the present disclosure. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples are collectively referred to as "wafers" hereafter).

One or more robot arms (not shown) in EFEM 106 transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104.

Figure 2:
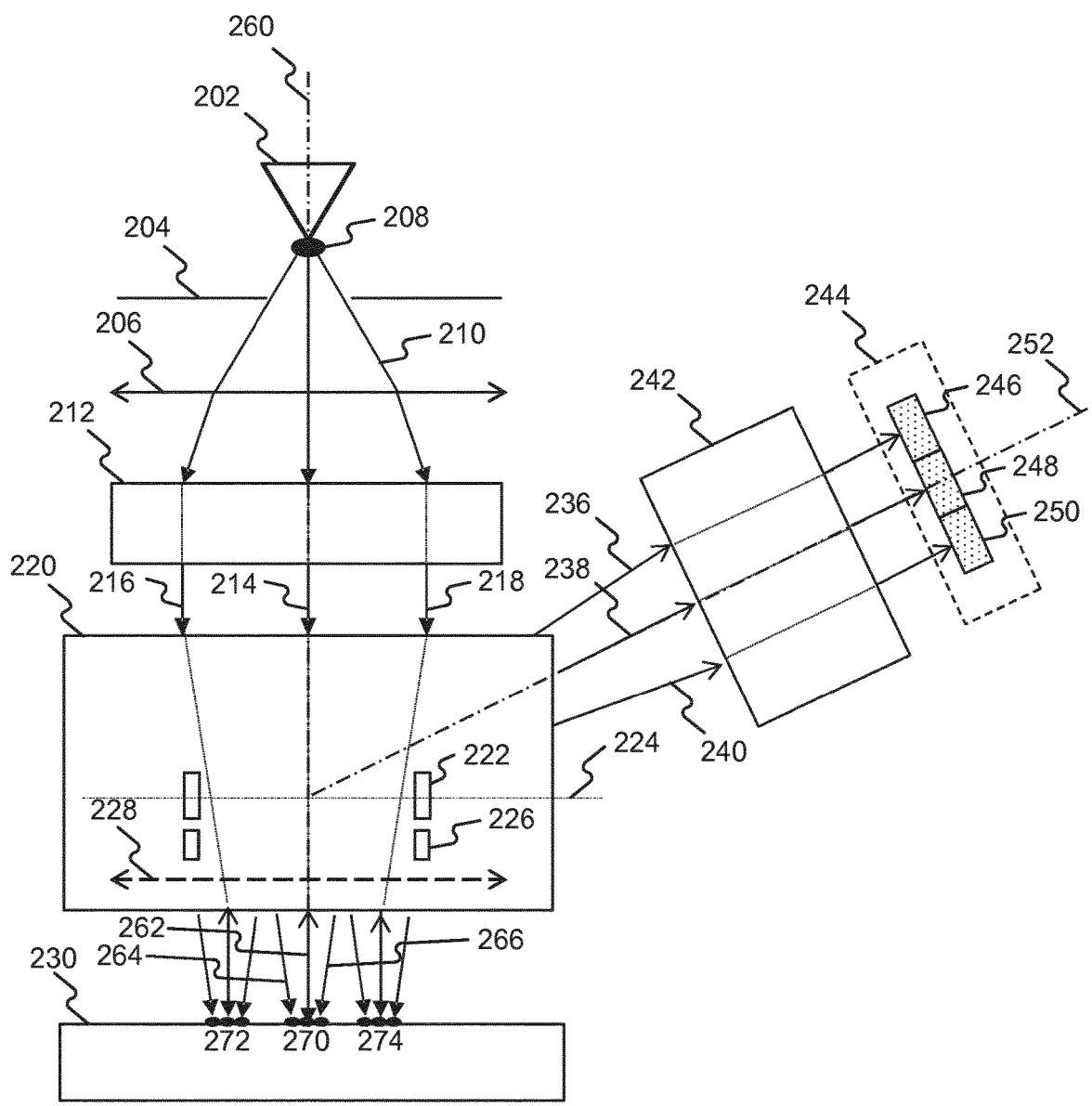
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates an electron beam tool 104 (also referred to herein as apparatus 104) comprising an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2), multiple secondary electron beams 236, 238, and 240, a secondary optical system 242, and an electron detection device 244. Primary projection optical system 220 can comprise a beam separator 222, deflection scanning unit 226, and objective lens 228. Electron detection device 244 can comprise detection elements 246, 248, and 250.

Electron source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and electron detection device 244 can be aligned with a secondary optical axis 252 of apparatus 104.

Electron source 202 can comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 204 can block off peripheral electrons of primary electron beam 210 to reduce Coulomb effect. The Coulomb effect can cause an increase in size of probe spots 270, 272, and 274.

Source conversion unit 212 can comprise an array of image-forming elements (not shown in FIG. 2) and an array of beam-limit apertures (not shown in FIG. 2). The array of image-forming elements can comprise an array of micro-deflectors or micro-lenses. The array of image-forming elements can form a plurality of parallel images (virtual or real) of crossover 208 with a plurality of beamlets 214, 216, and 218 of primary electron beam 210. The array of beam-limit apertures can limit the plurality of beamlets 214, 216, and 218.

Condenser lens 206 can focus primary electron beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for inspection and can form a plurality of probe spots 270, 272, and 274 on surface of wafer 230.

Beam separator 222 can be a beam separator of Wien filter type comprising an electrostatic deflector generating an electrostatic dipole field and a magnetic dipole field. In some embodiments, if they are applied, the force exerted by electrostatic dipole field on an electron of beamlets 214, 216, and 218 can be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 can be non-zero. For a dispersion plane 224 of beam separator 222, FIG. 2 shows dispersion of beamlet 214 with nominal energy $V_0$ and an energy spread $\Delta V$ into beamlet portions 262 corresponding to energy $V_0$, beamlet portion 264 corresponding to energy $V_0+\Delta V/2$, and beamlet portion 266 corresponding to energy $V_0-\Delta V/2$. The total force exerted by beam separator 222 on an electron of secondary electron beams 236, 238, and 240 can be non-zero. Beam separator 222 can therefore separate secondary electron beams 236, 238, and 240 from beamlets 214, 216, and 218 and direct secondary electron beams 236, 238, and 240 towards secondary optical system 242.

Deflection scanning unit 226 can deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 can be emitted from wafer 230. Secondary electron beams 236, 238, and 240 can comprise electrons with a distribution of energies including secondary electrons (energies≤50 eV) and backscattered electrons (energies between 50 eV and landing energies of beamlets 214, 216, and 218). Secondary optical system 242 can focus secondary electron beams 236, 238, and 240 onto detection elements 246, 248, and 250 of electron detection device 244. Detection elements 246, 248, and 250 can detect corresponding secondary electron beams 236, 238, and 240 and generate corresponding signals used to reconstruct an image of surface area of wafer 230.

Figure 3A:
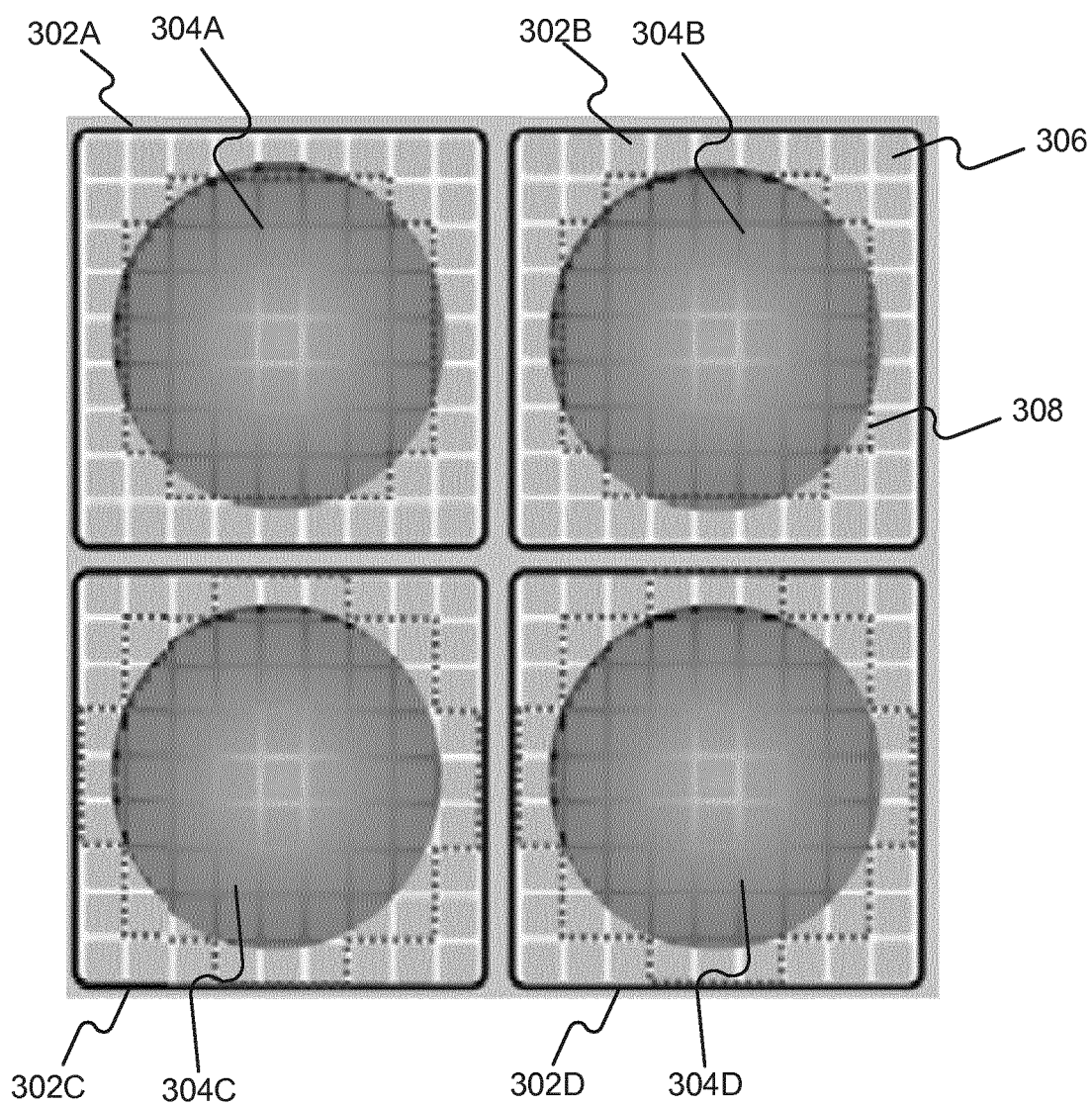
FIGS. 3A-3D are diagrams illustrating exemplary methods of determining the intensity of an electron beam spot, consistent with embodiments of the present disclosure.

Reference is now made to FIG. 3A, which illustrates an exemplary structure of a sensor surface 300 of an electron detection device 244. Sensor surface 300 can be divided into four regions 302A-D (2×2 rectangular grid), each region 302 capable of receiving a corresponding beam spot 304 emitted from a particular location on the wafer. All beam spots 304A-D have the ideal round shape and have no loci offset. And while four regions are displayed, it is appreciated that any plurality of regions could be used.

Each sensor region can comprise an array of electron sensing elements 306. The electron sensing elements may comprise, for example, a PIN diode, an electron multiplier tube (EMT), etc. Moreover, it is appreciated that while FIG. 3A shows each region 302 being separated from each other as predefined regions having their own sensing elements 306, it is appreciated that these predefined regions may not exist, e.g., such as surface sensor 400 of FIG. 4A. For example, instead of having 4 predefined regions each having 81 sensing elements (9×9 grid of sensing elements), sensor surface could have one 18×18 grid of sensing elements, still capable of sensing four beam spots.

Electron sensing elements 306 can generate a current signal commensurate with the electrons received in the sensor region. A preprocessing circuit can convert the generated current signal into a voltage signal (representing the intensity of received electron beam spot). The preprocessing circuit may comprise, for example, a high speed transimpedance amplifier. A processing system can generate an intensity signal of the electron beam spot by, for example, summing the voltages generated by the electron sensing elements located within a sensor region, correlate the intensity signal with a scan path data of the primary electron beam incident on the wafer, and construct an image of the wafer based on the correlation.

In some embodiments, the processing system can selectively sum the voltages generated by some of the electron sensing elements 306 to generate an intensity value of a beam spot. The selection can be based on a determination of which of the electron sensing elements are located within the beam spot.

In some embodiments, the processing system can identify which of the electron sensing elements are located outside a beam spot, and which of the electron sensing elements are located within the beam spot, by identifying a boundary of the beam spot. For example, referring to FIG. 3B, the processing system can identify primary boundaries 312A-B and secondary boundaries 314A-B for beam spots 304A-B. Primary boundary 312 can be configured to enclose a set of electron sensing elements 306 of which the voltage outputs are to be included to determine an intensity of the beam spot. Thus, a determination can be made that that a set of electron sensing elements of the electron sensing elements is within the beam spot.

Secondary boundary 314 can be configured to enclose a center portion of the beam spot, and can be used to provide certain geometric information of the beam spot. The geometric information may include, for example, a shape of the beam spot, one or more loci of the beam spot, etc. Here, the loci may refer to a predetermine location within the beam spot, such as a center. As to be discussed in more details below, the processing system may also determine primary boundary 312 based on secondary boundary 314.

Moreover, based on the loci information, the processing system can also track a drift in the location of a beam spot 304 due to, for example, imperfections within the electron optical components or system introduced during manufacturing or assembling processes, and/or drift during long-term operation of the system. The processing system can update the boundary determinations, and the set of electron sensing elements to be included in the intensity determination, to mitigate the effect of the drifting on the accuracy of intensity determination. Further, the processing system can track any shift in the electron beam spots and so anti-deflection components that are used to track and compensate for electron beam deflections can be removed from the secondary optical system. This can simplify the design, manufacture, and maintenance of electron beam tool 104.

Figure 3B:
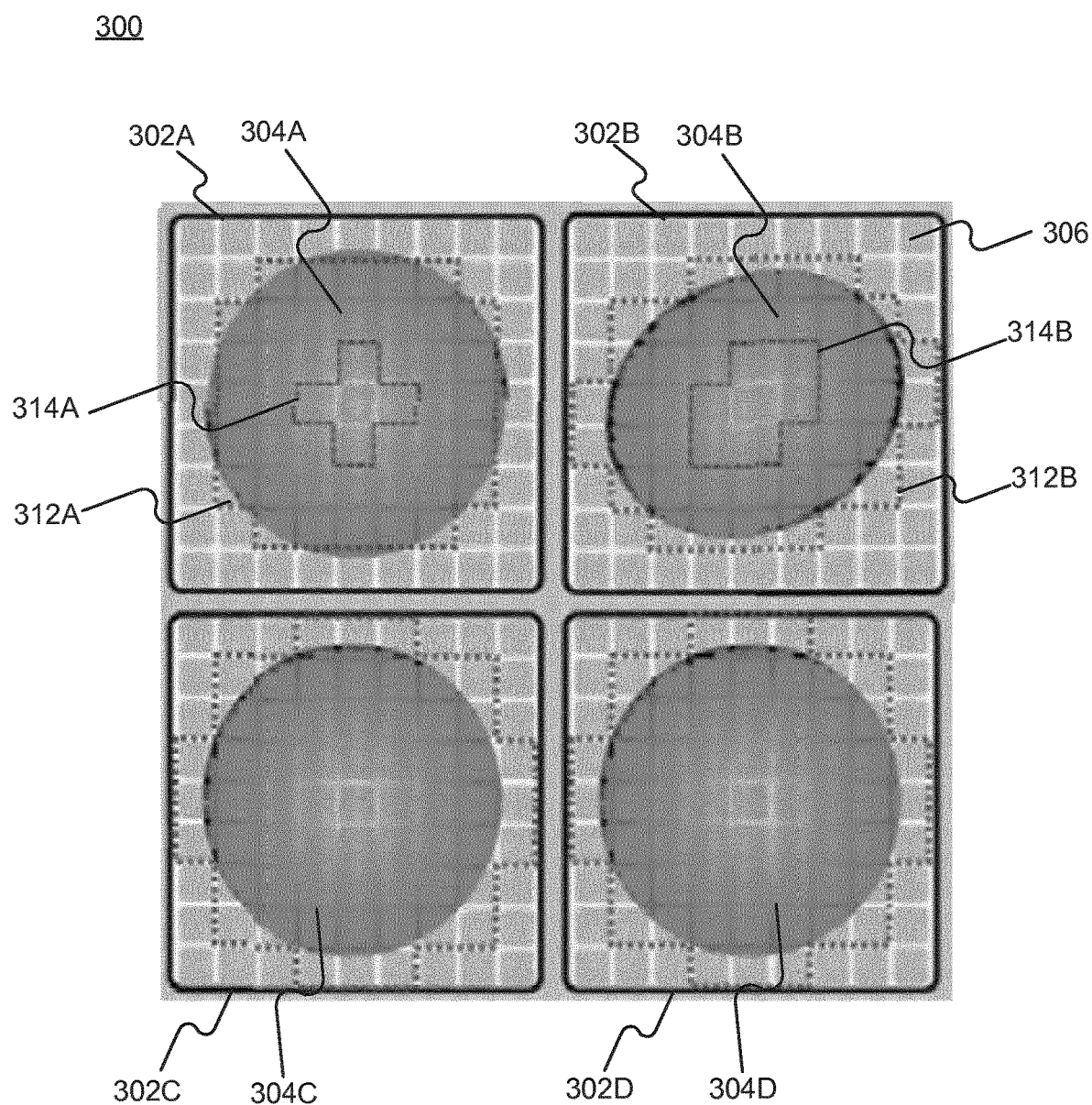

The selection of the electron sensing elements 306 that are used to form each set of electron sensing elements surrounded by primary or second boundaries 312 and 314 can be determined by a designated electron collection ratio of each beam spot, which is related to the overall image signal strength and signal to noise ratio, the signal crosstalk of the adjacent electron beams, and the corresponding shape and locus of each electron beam spot. The formation of each set can be static or can vary dynamically depending on whether the shape and locus variation of the each corresponding beam spot need to be tracked and compensated in real time. By providing the ability to acquire the beam position and shape in real time, the performance of the electron optical system (e.g., primary projection optical system 220) can be continuously monitored. Further, the information collected about the positioning and shape of the beam can facilitate the electron optical system adjustment during system assembly and maintenance processes, thereby making it possible to make real time automated alignments between the electron optical system and the electron detection device. Accordingly, while FIG. 3B shows beam spot 304B having a shape deviating from a preferred round shape, these types of deviations such as location, shape, and grid information due to drift in the electron optical system or imperfections of the components in the electron optical system can be compensated for in real time.

Figure 3C:
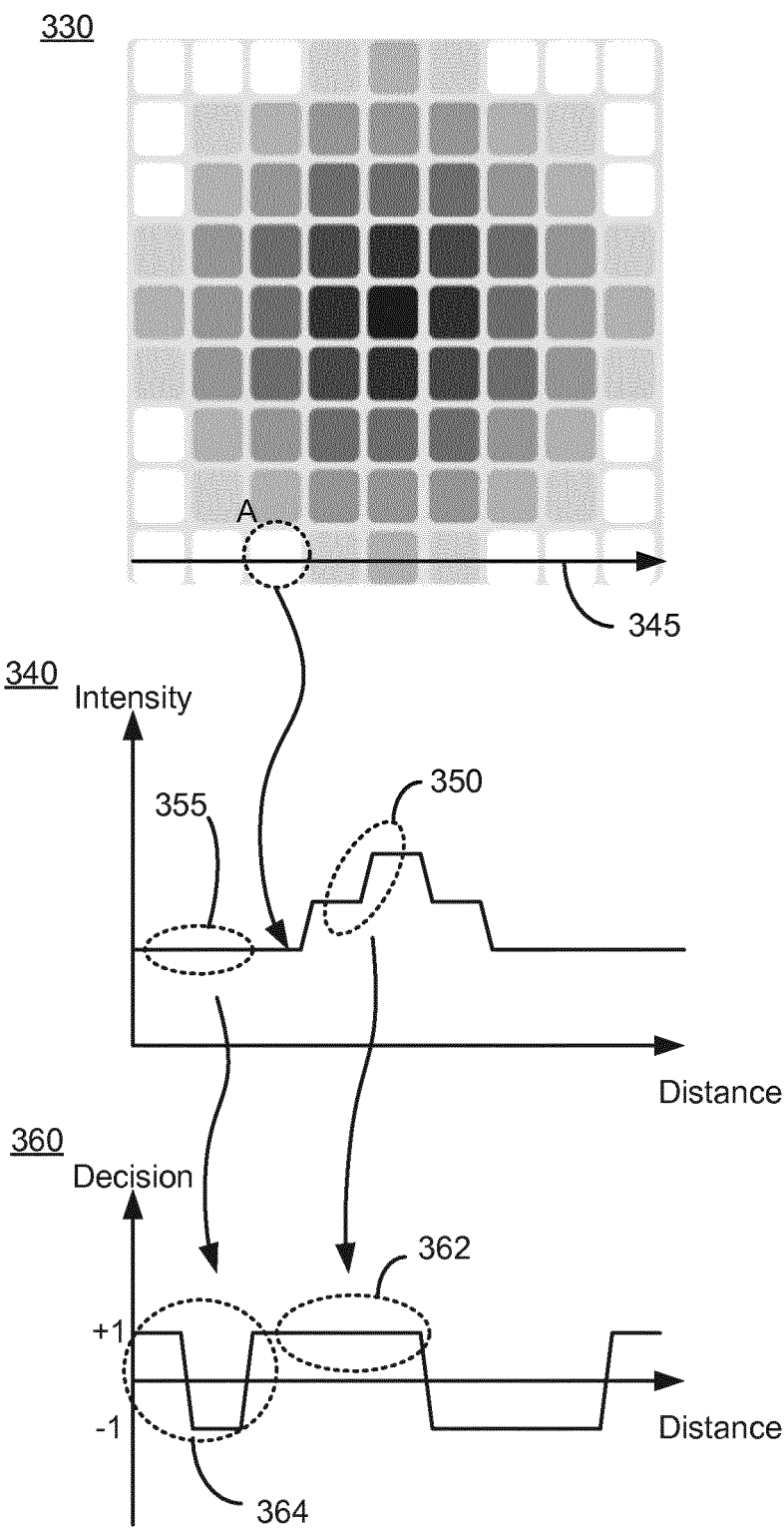

In some embodiments, the determination of primary and secondary boundaries can be based on detecting a predetermined pattern of intensity gradients across neighboring electron sensing elements. Reference is now made to FIG. 3C, which illustrates an example of a predetermined pattern used for determining primary boundary 312. FIG. 3C illustrates an intensity map 330 and an intensity graph 340. Intensity map 330 illustrates an intensity distribution of a beam spot (e.g., beam spot 304 of FIG. 3A), with each square representing an intensity of electrons received by one electron sensing element, with darker colors representing relatively higher intensities. The processing system can determine that the electron sensing elements represented by a color lighter than a predetermined threshold, for example, a white color, are outside the beam spot, and that the electron sensing elements represented by a color darker than the determined threshold, for example, a grey color, are within the beam spot. Based on these determinations, the processing system can exclude the outputs of the electron sensing elements represented by white color.

Moreover, intensity graph 340 illustrates the variation of intensity of electrons along an axis 345 in intensity map 330. As shown in FIG. 3C, intensity graph 340 illustrates different intensities at different locations. For example, near the center of the beam spot (labeled 350) the intensity is higher than near the boundary of the beam spot (labeled 355). The difference in intensities can be attributed to various factors including the tip size of electron source 202, aberration of the electron optics system, and electron dispersion. Moreover, in some embodiments, the intensities can be determined by the sample topography of scattered electrons, material for back-scattered electrons, charging conditions on the sample surface, landing energy, etc.

An intensity gradient can be generated based on a comparison of the electron intensity outputs between neighboring electron sensing elements. For example, the outputs of the signal conditioning circuits coupled with corresponding electron sensing elements of sensor surface of electron detection device 244 can be connected to a set of voltage comparators configured to compare the output voltages (which represent the received electron intensities) between neighboring electron sensing elements. The set of voltage comparators can generate a set of decisions. The processing system can track the intensity gradients based on the decisions and determine a location on the sensor surface where the intensity gradient changes as a part of primary boundary 312. For example, referring back to FIG. 3C, voltage decision graph 360 illustrates a distribution of voltage comparator decisions that corresponds to the intensity variation illustrated in intensity graph 340. The decisions may represent a comparison result of output voltages between neighboring electron sensing elements, with −1 representing the output voltage of electron sensing element on the left is higher than the output voltage of the electron sensing element on the right, and +1 representing the opposite.

The comparison results can reflect characteristic patterns of the intensity gradients at a boundary of a beam spot and at the interior of a beam spot. For example, as shown in FIG. 3C, the voltage comparator decisions 364 corresponding to intensities 355 may exhibit more toggling between +1 and −1, which can be due to the signal level differences in the electron intensity outputs from the processing system, corresponding to the electron current intensities received by adjacent electron sensing elements, being lower than the noise level. As a result, comparator decisions 364 (corresponding to a boundary of the beam spot) can be susceptible to random noise and can toggle either way. On the other hand, comparator decisions 362 corresponding to intensities 350 may be more stable across a set of neighboring electron sensing elements, due to the signal level differences in the electron intensity outputs being higher than the noise level. Based on the toggling pattern of the comparator outputs, the processing system can group the comparator decisions in voltage decision graph 360 into two sets that correspond to intensity gradients 362 and 364. Based on the locations of the electron sensing elements that give rise to the two sets of comparator decisions, the processing system can identify a location on the sensor surface where the transition between the intensity gradients 362 and 364 occurs, which can be the location marked location "A." The processing system can then determine the identified location as a part of primary boundary 312. The processing system can perform similar processing on the voltage comparator decisions for each row and each column of electron elements, to determine a set of locations on the sensor surface that make up primary boundary 312.

Figure 3D:
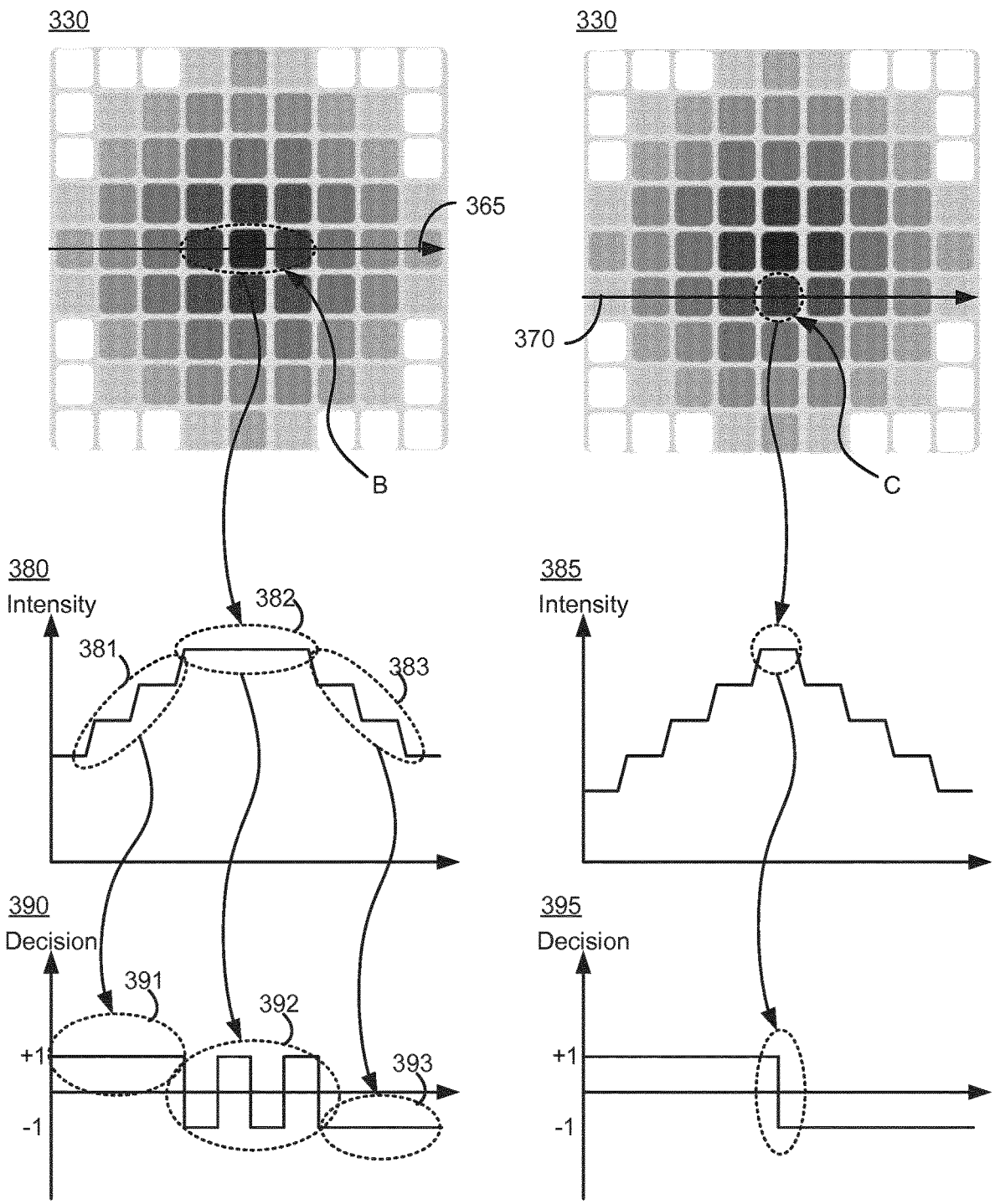

The processing system can also determine secondary boundary 314 by detecting other predetermined patterns in the voltage comparator decisions. Reference is now made to FIG. 3D, which illustrates an example of a predetermined pattern used for determining secondary boundary 314. FIG. 3D illustrates intensity map 330 of FIG. 3C, an intensity graph 380 that illustrates the variation of intensity of electrons along an axis 365 in intensity map 330, and an intensity graph 385 that illustrates the variation of intensity of electrons along an axis 370 in intensity map 330. Axes 365 and 370 can be along adjacent rows of electron sensing elements on the sensor surface.

FIG. 3D also illustrates a voltage decision graph 390 that corresponds to intensity graph 380, and a voltage decision graph 395 that corresponds to intensity graph 385. Both voltage decision graphs 390 and 395 represent comparison results of output voltages between neighboring electron sensing elements along, respectively, axes 365 and 370. Each voltage decision graph also exhibits a toggling of comparator decision at certain points along each of axes 365 and 370, which can indicate a change of polarity of the intensity gradient. For example, along axis 365, there is an increasing intensity before reaching a region of flat intensity around the center of the beam spot at location B, after which the intensity decreases. Correspondingly, along intensity graph 380, there are increasing intensities 381 associated with the increasing intensities of axis 365, flat intensities 382 associated with the flat region at location B of axis 365, and decreasing intensities 383 associated with the decreasing intensities of axis 365.

Referring to the corresponding voltage decision graph 390, the output voltage +1 corresponding to comparator decisions 391 reflects the increasing intensities 381 from intensity graph 380, and the output voltage −1 corresponding to comparator decisions 393 reflects the decreasing intensities 383 from intensity graph 380. The voltage comparator decisions 392 corresponding to intensities 382 may exhibit more toggling between +1 and −1, which can be due to the signal level differences in the electron intensity outputs from the processing system, corresponding to the electron current intensities received by adjacent electron sensing elements, being lower than the noise level. As a result, comparator decisions 392 can be susceptible to random noise and can toggle either way.

On the other hand, along axis 370 there is a relatively sharp transition of intensity gradients, and the toggling occurs at a location (marked "C") at the middle of axis 370. Based on the differences in the toggling positions between adjacent rows (and columns), the processing system can determine a set of locations on the sensor surface that make up secondary boundary 314. For example, the processing system can determine that locations B and C are parts of secondary boundary 314.

In some embodiments, the processing system can also improve the fidelity of the image reconstruction by compensating for the effect of noise signals using the boundary information. As discussed above, the fidelity of image reconstruction can be degraded by noise signals that are generated by electron detection device 244 and that are not caused by the scattered primary electrons or the secondary electrons emitted by the wafer. These noise signals can include, for example, dark currents that may be generated without receiving any electrons. These noise signals may appear at electron sensing elements that are located within a beam spot, as well as at electron sensing elements that are located outside the beam spot. The noise signals may be random noise signals, which are independent in each of the electron sensing elements or the noise signals may be systemic noise signals, which have a similar pattern and same or different amplitude in each sensing element of a certain region or whole of the detector. With embodiments of the present disclosure, the processing system can exclude the signal received from outputs of electron sensing elements that are determined to be located outside primary boundary 312. This can improve fidelity of image reconstruction by eliminating the random noise signals from electron sensing elements outside primary boundary 312. Further, in some embodiments, the processing system can obtain a value representing noise signals from the outputs of electron sensing elements that are determined to be outside primary boundary 312. After generating the intensity value from the outputs of electron sensing elements located within primary boundary 312, the processing system can subtract the value representing the noise signal components from the intensity value. By removing or reducing the systemic noise signal components present in the intensity values, the fidelity of the image reconstruction can be improved.

Figure 4A:
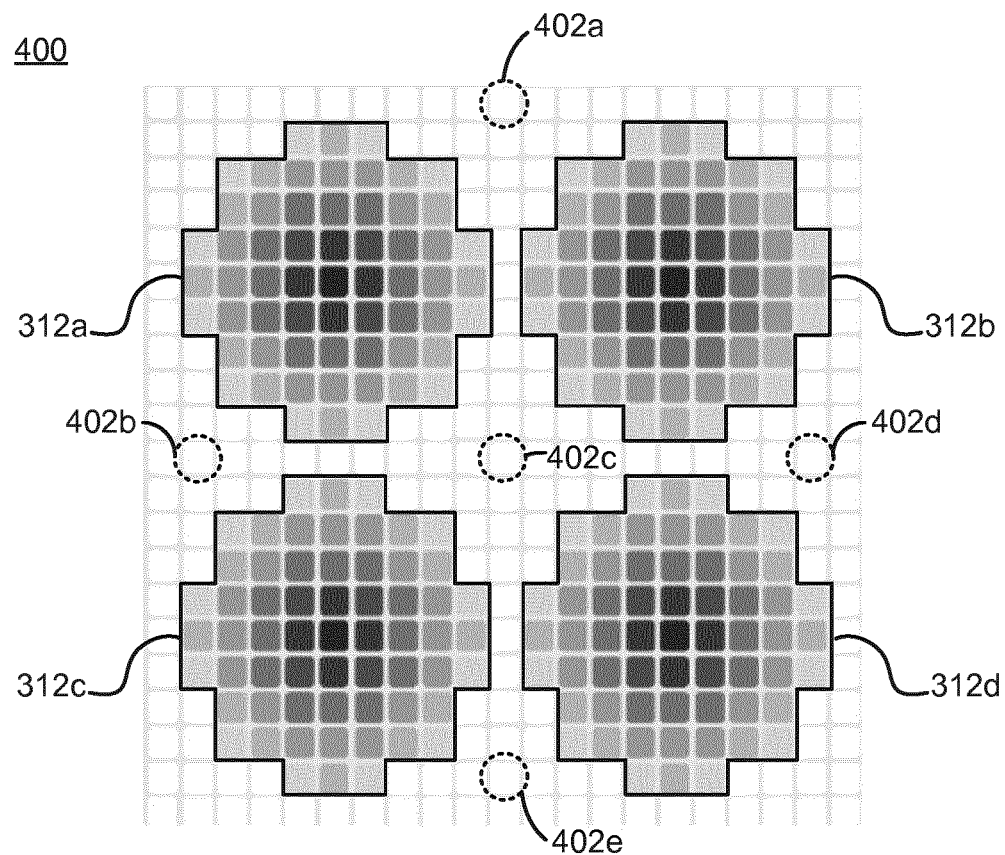

Reference is now made to FIG. 4A, which illustrates a set of intensity maps 400 that corresponds to four beam spots formed on a sensor surface. Based on the voltage comparator decisions associated with the intensity maps, the processing system can obtain primary boundaries 312a, 312b, 312c, and 312d for each of the beam spots. The processing system can sum the outputs of electron sensing elements that are enclosed by each of primary boundaries 312a, 312b, 312c, and 312d to obtain the intensity value for each of the beam spots. Moreover, based on these primary boundaries, the processing system can also identify a set of electron sensing elements including, for example, 402a, 402b, 402c, 402d, and 402e that are outside these primary boundaries.

The processing system can obtain the outputs of the electron sensing elements (or idle electron sensing elements) outside the primary boundaries (e.g., electron sensing element 402a) as a representation of the noise signals due to interference sources near the detector. In some embodiments, the processing system can average these outputs to obtain a value representing the noise signals, and subtract the value from the intensity value of each beam spot. In some embodiments, the processing system can also associate the idle electron sensing elements outside the primary boundaries of the beam spots based on their locations, and perform the subtraction for a beam spot based on noise signals from one or more associated idle electron sensing elements. As an illustrative example, in the example shown in FIG. 4A, the processing system may selectively subtract noise signals of electron sensing elements 402b, 402c, and 402e (but not of electron sensing elements 402a and 402d) from the beam spot enclosed by primary boundary 312c, to remove the noise components and generate a compensated intensity value for that beam spot.

The processing system can also mitigate or eliminate the noise signals caused by crosstalk using the boundary information. As discussed above, crosstalk can occur with partial overlap of beam spots formed by adjacent electron beams due to aberration and dispersion. In some embodiments, the processing system can detect the occurrence of the partial overlapping based on primary boundaries 312 (e.g., as shown in FIG. 4B) of neighboring beam spots. Further, in some embodiments, the processing system can also include secondary boundaries 314 of neighboring beam spots in detecting the occurrence of the partial overlapping. Based on the detection, the processing system can determine that some of the electron sensing elements are located in the area where the beam spots overlap, and exclude the outputs from those electron sensing elements when determining the intensity values of the beam spots. Therefore, the need for aberrant correction hardware in the electron optical subsystem to reduce or eliminate overlaps between adjacent beam spots due to dispersion can be relaxed, or can even be eliminated. As a result, the complexity of electron beam tool 104 can be reduced, which can improve the performance and reliability of the tool. Further, the aberrant correction hardware in the electron optical sub-system can cause significant intensity reduction of detected electron beams and reduce signal-to-noise ratio. The crosstalk determination and mitigation provided by the processing system can be used to adjust the balance between signal-to-noise ratio and crosstalk in real time. The ability to adjust the balance between signal-to-noise ratio and crosstalk in real time can greatly improve the flexibility and performance of the electron beam tool.

Reference is now made to FIG. 4B, which illustrates an intensity map 410 that corresponds to two partially-overlapping beams spots. In this example, the processing system determines a primary boundary 312e (represented by solid lines) for the beam spot on the left, and a primary boundary 312f (represented by dotted lines) for the beam spot on the right. The processing system also determines a secondary boundary 314e (represented by solid lines) for the beam spot on the left, and a secondary boundary 314f (represented by dotted lines) for the beam spot on the right.

There are various ways by which the processing system detects the partial overlapping between the two beam spots. For example, the processing system can determine a distance 412 between primary boundary 312e and secondary boundary 314e of the left beam spot, and a distance 414 between secondary boundary 314e of the left beam spot and primary boundary 314f of the right beam spot. Based on a determination that distance 414 is shorter than distance 412, the processing system can determine a part of primary boundary 312f of the right beam spot encroaches on the primary boundary 312e of the left beam spot. Based on the determination of encroachment, the processing system can determine that the two beam spots overlap partially.

As another example, the processing system can determine a distance 416 between the centers of the two beam spots based on secondary boundaries 314e and 314f. Based on a determination that distance 416 falls below a predetermined threshold, the processing system can determine that the two beam spots overlap partially. The threshold may be determined based on, for example, an estimated radius of the beam spots based on, for example, a distance between primary boundary 312e and the center of the left beam spot, a distance between primary boundary 312f and the center of the right beam spot, a combination of both, etc. The processing system can then determine a region 420 where overlapping occurs, and exclude the outputs of electron sensing elements located within region 420 from the intensity value determination for both of the beam spots.

While excluding the outputs of electron sensing elements located within region 420 can reduce the noise due to crosstalk, the exclusion also reduces the intensity value generated for the beam spots. As a result, beam spots emitted from identical wafer structures may have different intensity values. The difference can lead to distortion in the representation of the wafer structure with the intensity values. In some embodiments, to mitigate the effect of distortion, the processing system can determine a scaling factor for shrinking the primary boundaries of all of the beam spots on the sensor surface, with the scaling factor being determined such that the updated primary boundary 312ee (scaled from primary boundary 312e) and updated primary boundary 312ff (scaled from primary boundary 312f) no longer overlap at region 420.

The shrinking factor can be determined based on various considerations. For example, the shrinking factor can be based on a ratio between distances 412 and 416. Moreover, as discussed above, by excluding the outputs of more electron sensing elements from the generation of the intensity value of a beam spot, the intensity value generated will be reduced. The reduction may reduce the intensity value relative to noise components (e.g., from dark current, interference sources, etc.), leading to a lower signal-to-noise ratio. With a reduced signal-to-noise ratio, the intensity distribution generated from the beam spots may become more susceptible to the noise signals, which can degrade the fidelity of the image reconstruction. Therefore, the shrinking factor can also be determined such that the resultant signal-to-noise ratio equals or exceeds a predetermined threshold. With such arrangements, the intensity values of all of the beam spots can be scaled by the same scaling factor to avoid distortion, while the crosstalk noise signals can also be removed or reduced. Further, the same electron detection device 244 can be utilized in electron beam tools comprising different numbers of detected beam spots. The processing system can update beam spot boundaries to detect the different beam spots.

Figure 4C:
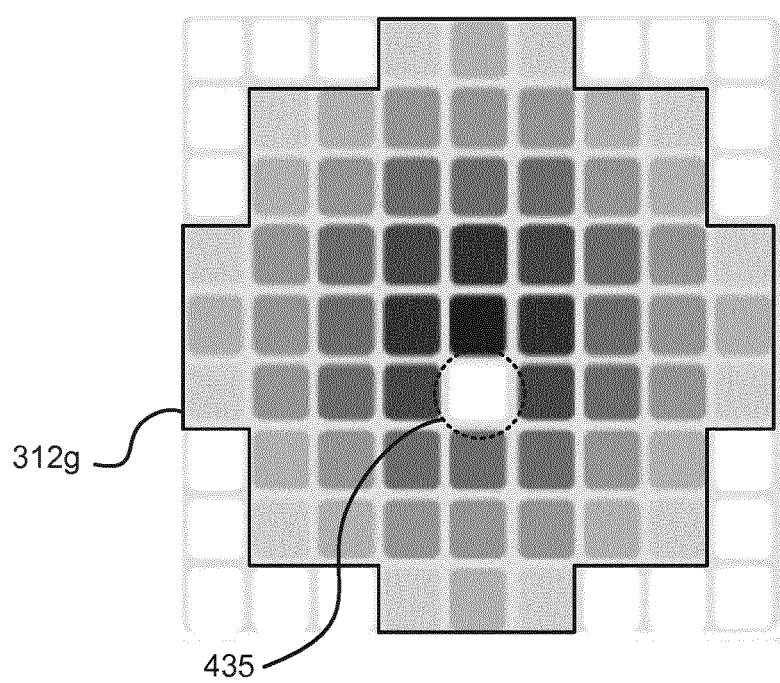

In some embodiments, the processing system can also mitigate the effects of some other noise sources using the boundary information. For example, as shown in FIG. 4C, the processing system may determine that electron sensing element 435 malfunctions, based on the low intensity output by electron sensing element 435, and that the element is located within primary boundary 312g. Based on this determination, the processing system can exclude the output of electron sensing element 435 from the intensity value generation for the beam spot enclosed by primary boundary 312g.

Figure 5A:
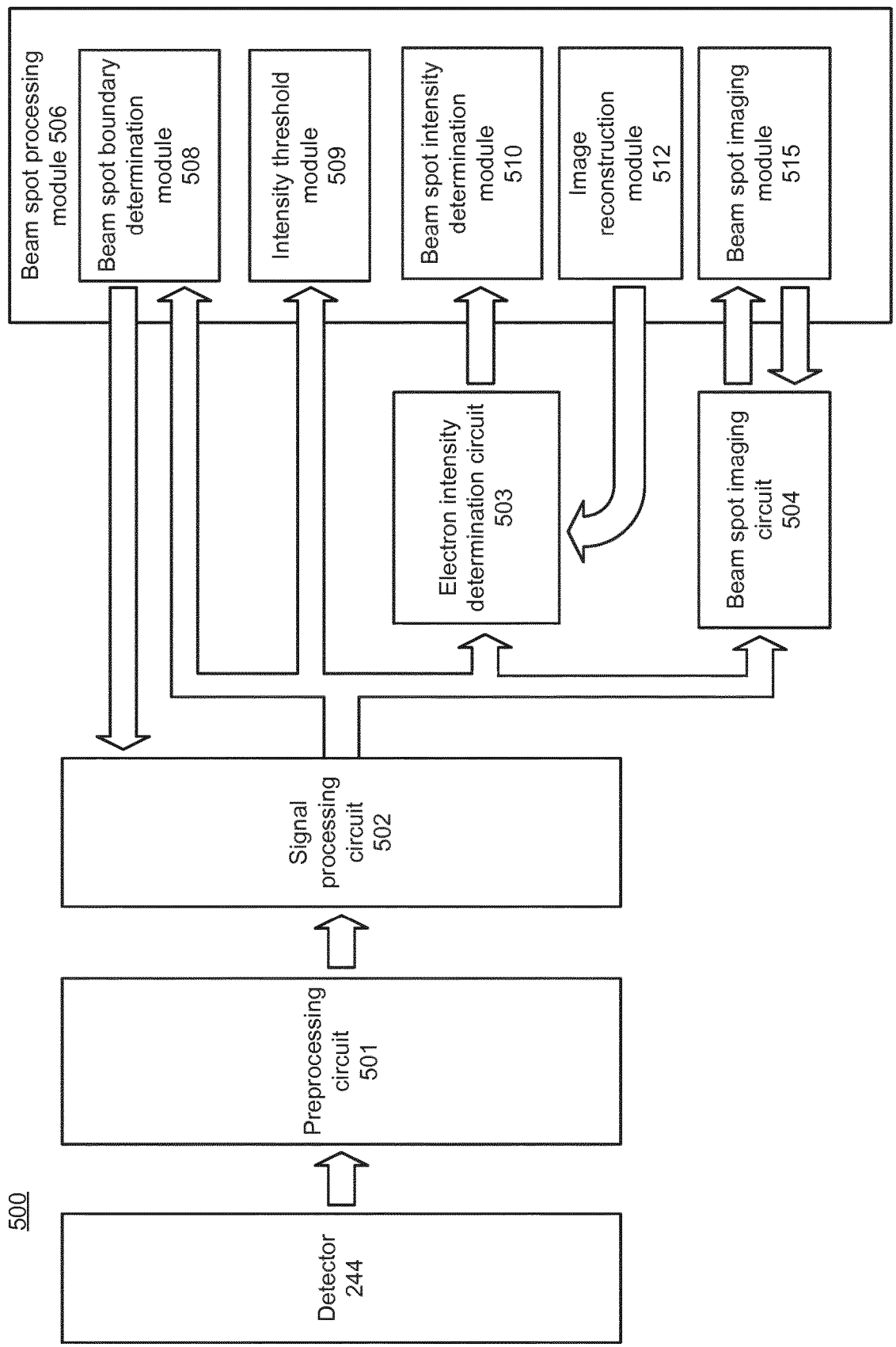
FIGS. 5A-5C are schematic diagrams illustrating an exemplary system for processing electron detector output, consistent with embodiments of the present disclosure.

Reference is now made to FIG. 5A, which illustrates an exemplary processing system 500 for processing electron detector output according to embodiments of the present disclosure. Processing system 500 can be a part of, or coupled with, electron beam tool 104 of FIG. 2. Processing system 500 can receive the generated electrical signals from the plurality of electron sensing elements of electron detection device 244, determine an intensity value for each of the one or more detected electron beam spots, and reconstruct an image of the wafer based on the intensity values. As shown in FIG. 5A, system 500 can include electron detection device 244 (of FIG. 2), pre-processing circuit 501, signal processing circuit 502, electron intensity determination circuit 503, beam spot imaging circuit 504 and beam spot processing module 506. Beam spot processing module 506 can further include beam spot boundary determination module 508, intensity threshold module 509, beam spot intensity determination module 510, image reconstruction module 512 and beam spot imaging module 515.

In general, the word "module," as used herein, can be a packaged functional hardware unit designed for use with other components (e.g., portions of an integrated circuit) and/or a part of a program (stored on a computer readable medium) that performs a particular function of related functions. The module can have entry and exit points and can be written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other non-transitory medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an erasable programmable read-only memory (EPROM). It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

Figure 5B:
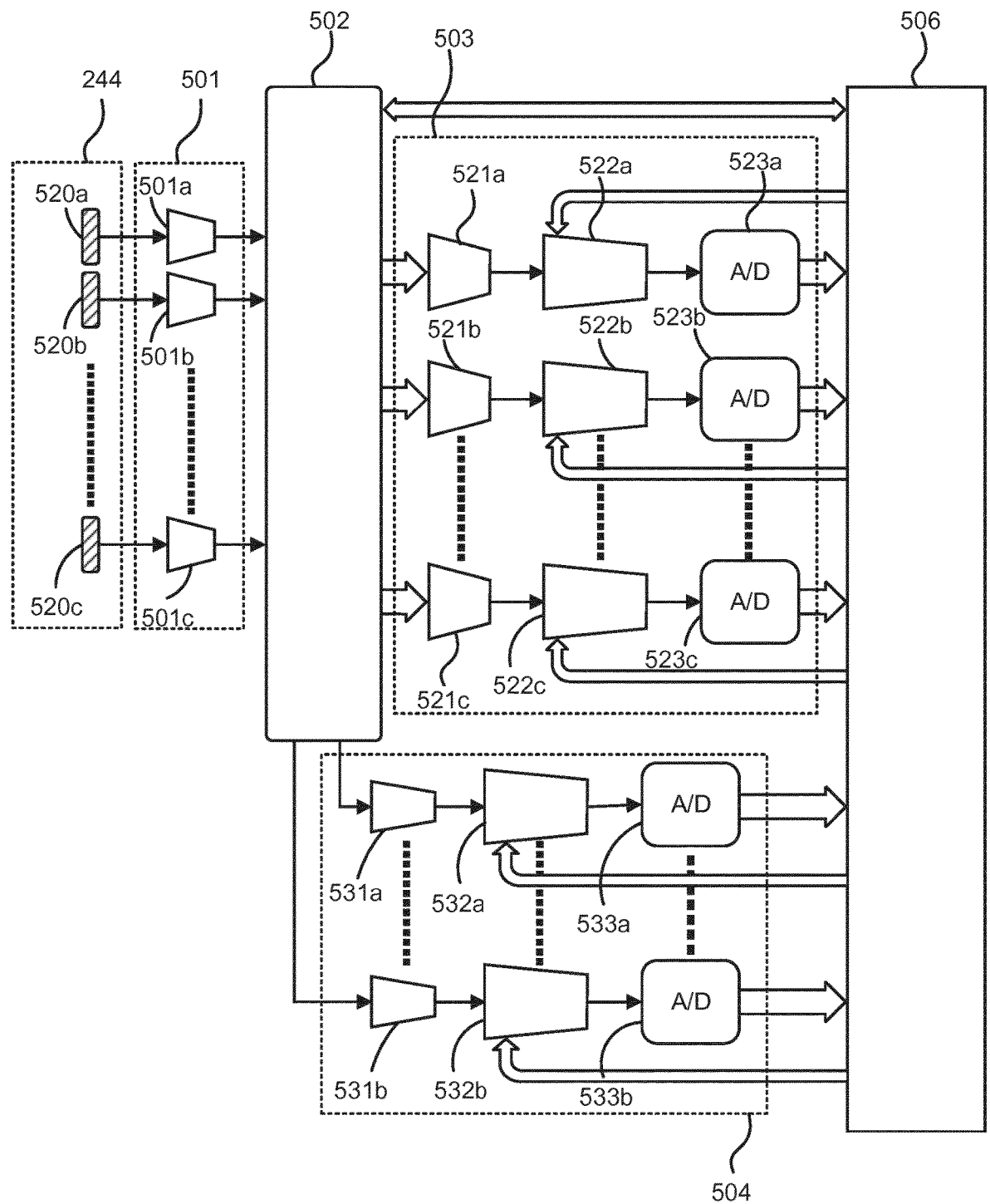

Pre-processing circuit 501 can process the outputs of the electron sensing elements of electron detection device 244, to generate intensity signals representing an intensity of electrons received by each of the electron sensing elements. Reference is now made to FIG. 5B, which illustrates exemplary components of pre-processing circuit 501, signal processing circuit 502, electron intensity determination circuit 503, and beam imaging circuit 504. As shown in FIG. 5B, pre-processing circuit 501 can include signal conditioning circuits 501a, 501b, . . . 501c, coupled with corresponding electron sensing elements 520a, 520b, . . . 520c of electron detection device 244. Each of signal conditioning circuits 501a, 501b, . . . 501c may include, for example, an amplifier, an amplifier input protection circuit, etc., configured to amplify and filter the output by each of the electron sensing elements 520a, 520b, . . . 520c. Pre-processing circuit 501 can then transmit the amplified and filtered voltages, as intensity signals, to signal processing circuit 502.

Figure 5C:
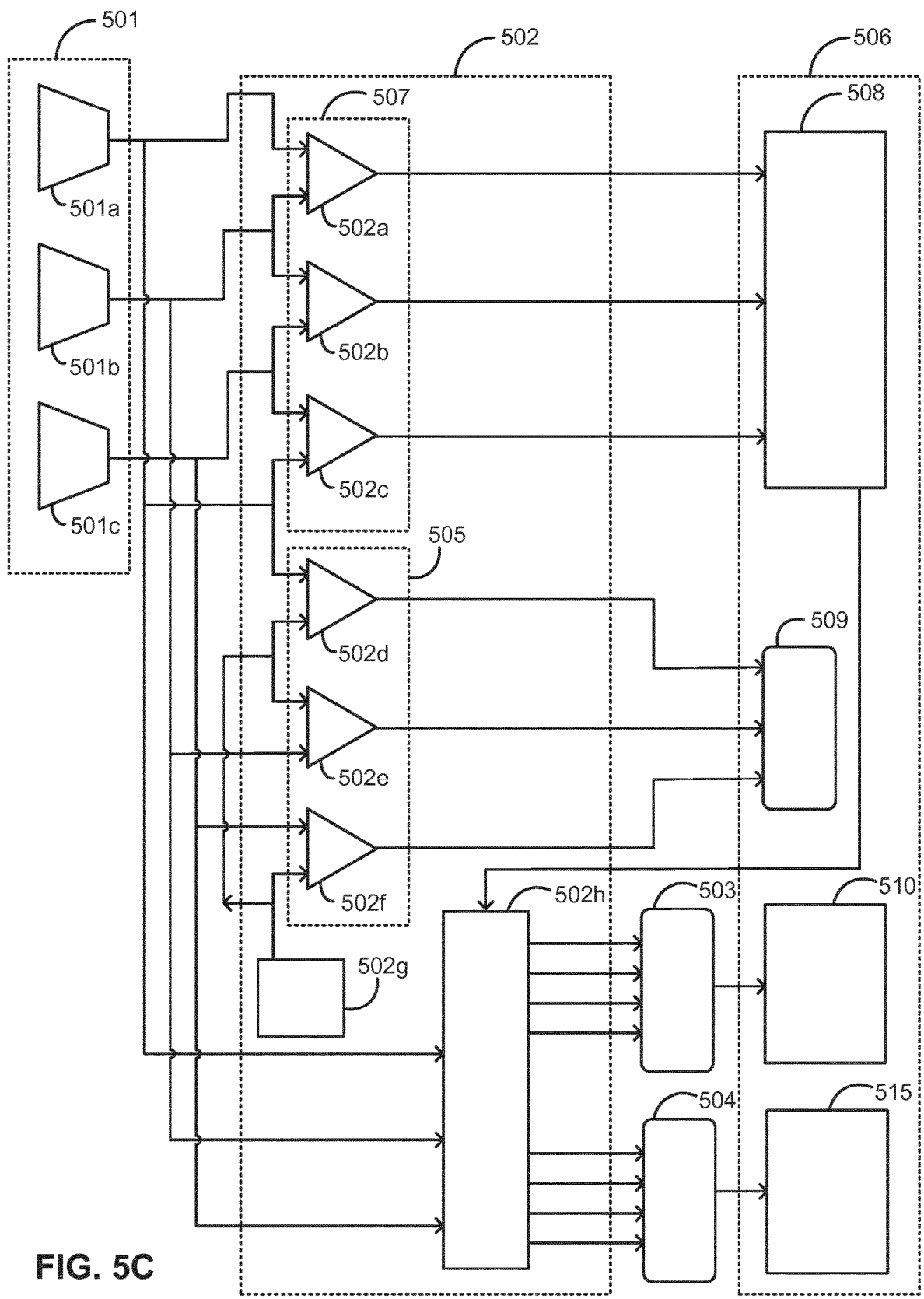

Reference is now made to FIG. 5C, which illustrates exemplary components of signal processing circuit 502. As shown in FIG. 5C, signal processing circuit 502 can include signal threshold circuit 505, intensity gradient determination circuit 507, reference voltage generation circuit 502g, signal switch matrix 502h, peak detection circuits (not shown in FIG. 5C), and analog-to-digital convertors (not shown in FIG. 5C).

In some embodiments, signal threshold circuit 505 can comprise voltage comparators 502d, 502e, and 502f. Voltage comparators 502d, 502e, and 502f can be configured to compare the instantaneous signal voltages of the signals from the signal conditioning circuits 501a, 501b, and 501c with the voltage from reference voltage generation circuit 502g. The outputs of voltage comparators 502d, 502e, and 502f can be forwarded to intensity threshold module 509. The reference voltage generated by reference voltage generation circuit 502g may be a predetermined intensity threshold. Any pre-processed intensity signal below the predetermined intensity threshold can be attributed to electron sensing elements without beam signal output and can be used to estimate noise signal levels.

In other embodiments, instead of using voltage comparators, signal threshold circuit 505 can comprise analog-to-digital convertors with a bit resolution greater than one bit, thereby allowing the ability to provide more detailed information regarding the amplitude of the signal level. For example, instead of just indicating whether the signal level is higher or lower than the predetermined intensity threshold, the output of signal threshold circuit 505 can indicate a range of amounts that the signal level is higher or lower than the threshold.

In some embodiments, intensity gradient determination circuit 507 can comprise voltage comparators 502a, 502b, and 502c. Voltage comparators 502a, 502b, and 502c can be configured to compare the intensity signals output by neighboring electron sensing elements. The comparators can generate a set of comparator decisions (e.g., as depicted in voltage decision graphs 360, 390, and 395) to provide indications of variations of intensity gradients. For example, referring to FIG. 5B and FIG. 5C, comparator 502a is configured to compare the pre-processed intensity signals from 501a and 501b corresponding to signals generated from neighboring electron sensing elements 520a and 520b. Comparator 502b is configured to compare the pre-processed intensity signals from 501b and 501c corresponding to signals generated from neighboring electron sensing elements 520b and 520c. Further, comparator 502c is configured to compare the pre-processed intensity signals from 501a and 501c corresponding to signals generated from neighboring electron sensing elements 520a and 520c. Intensity gradient determination circuit 507 can forward the comparator decisions, as well as the locations (which can be represented as two-dimensional co-ordinates) of electron sensing elements that correspond to the comparator decisions, to beam spot boundary determination module 508 of beam spot processing module 506.

In other embodiments, instead of using voltage comparators, intensity gradient determination circuit 507 can comprise analog-to-digital convertors with a bit resolution greater than one bit. By using such analog-to-digital convertors, intensity gradient determination circuit 507 can provide a gradient with a higher resolution.

Beam spot boundary determination module 508 can process the comparator decisions and the location information associated with the comparator decisions, and determine primary boundary 312 and secondary boundary 314 for a beam spot. The determination of the boundaries can be based on, for example, detecting predetermined patterns in the comparator decisions as described above with respect to FIG. 3C and FIG. 3D. Beam spot boundary determination module 508 may also update the determined boundaries based on, for example, detection of partial overlaps between neighboring beam spots, as described above with respect to FIG. 4B.

In some embodiments, signal processing circuit 502 may not include intensity gradient determination circuit 507. Beam spot boundary determination module 508 can determine primary and secondary beam boundaries (for example, primary boundary 312 and secondary boundary 314) based on input from beam spot imaging module 515. Beam spot boundary determination module 508 can include image processing algorithms to determine primary and secondary beam boundaries based on beam spot images provided by beam spot imaging module 515. Further, beam spot boundary determination module 508 can include image processing algorithms to determine partial overlap between neighboring beam spots (for example region 420 of FIG. 4B) based on beam spot images provided by beam spot imaging module 515. Beam spot boundary determination module 508 can provide a set of locations (represented as two-dimensional co-ordinates) that represent primary boundary 312 and secondary boundary 314 to signal switch matrix 502h.

Signal switch matrix 502h can group the pre-processed intensity signals received from signal conditioning circuits 501a, 501b, and 501c. The grouping can be performed according to the beam spot boundary information sent from beam spot boundary determination module 508 so that groups of the electronic signals corresponding to groups of electron sensing elements are formed. Signal switch matrix 502h can include a set of multiplexors configured to select which of the pre-processed intensity signals corresponding to electron sensing elements 520a, 520b, and 520c are to be forwarded to electron intensity determination circuit 503. For example, signal switch matrix 502h can exclude one or more of the outputs corresponding to electron sensing elements 520a, 520b, and 520c, based on a determination that the electron sensing elements are located outside the primary boundary. Each group of the electronic signals can be transmitted to electron intensity determination circuit 503. Electron intensity determination circuit 503 can generate an electronic signal that represents the overall intensity of the corresponding portion of the electron beam.

In some embodiments, signal switch matrix 502h can also be configured to scan the signals from the pre-processed intensity signals from signal conditioning circuits 501a-501c and forward the scanned signals to beam spot imaging circuit 504. Signal switch matrix 502h can implement the scanning process by selecting which of the received inputs to forward to beam spot imaging circuit 504. The scanning rate can be controlled by beam spot processing module 506. For example, the pre-processed signals corresponding to the electron sensing elements may be sequentially scanned (one at a time) or the pre-processed signals corresponding to multiple electron sensing elements may be simultaneously scanned (for example, signals corresponding to one electron sensing element of each row of sensor surface 300 may be scanned simultaneously). Further, the scanned region may also be controlled by beam spot processing module 506. For example, referring to FIG. 3A, switch matrix 502h can be configured to only scan the pre-processed signals corresponding to electron sensing elements of sensor region 302A and not scan the pre-processed signals corresponding to electron sensing elements of sensor region 302D.

In some embodiments, peak detection circuits of signal processing circuit 502 can be configured to determine the minimum and maximum voltage levels of the signal from each signal conditioning circuit 501a, 501b, and 501c. Further, analog-to-digital convertors of signal processing circuit 502 can be configured to digitize the peak signals and forward the digitized signals to beam spot processing module 506, which can communicate with external components (e.g., controller or data repository) via a bus (not shown).

Referring back to FIG. 5B, electron intensity determination circuit 503 can include summing amplifiers 521a, 521b, . . . 521c, post-signal conditioning circuits 522a, 522b, . . . 522c, and analog to digital converters 523a, 523b, . . . 523c. Summing amplifiers 521a, 521b, . . . 521c can be configured to receive the grouped electronic signals transmitted from signal switch matrix 502h. Summing amplifiers 521a, 521b, . . . 521c can be configured to sum the outputs of some or all of signal conditioning circuits 501a, 501b, . . . 501c and provide a summing signal representing the overall intensity of the corresponding portion of the electron beam. Post-signal conditioning circuits 522a, 522b, . . . 522c can include variable gain amplifiers (VGA) and offset voltage generation circuits. The variable gain amplifiers can amplify the summing signal output from summing amplifiers 521a, 521b, . . . 521c. The variable gain amplifier can modify the contrast of the reconstructed wafer image and increase the dynamic range of the image channel. The offset voltage generation circuits can be configured to add an offset voltage to the amplified signal from the VGA to adjust the brightness of the reconstructed wafer image. The amplifier gain and offset voltage of post-signal conditioning circuits 522a, 522b, . . . 522c can be controlled by beam spot processing module 506. The analog to digital converters 523a, 523b, . . . 523c can be configured to convert the analog signals provided by post-signal conditioning circuits 522a, 522b, . . . 522c into a set of digital signals and provide the digital signals to beam spot intensity determination module 510. The digital signal can correspond to the sum of intensity of a part of a beam spot. In some embodiments, electron intensity determination circuit 503 may include additional summing amplifiers, offset correction circuits, variable gain amplifiers, and analog-to-digital converter circuits to generate noise measurements from electron sensing elements that are determined to be outside the primary boundary, and provide the noise measurements to beam spot intensity determination module 510 as well.

Beam spot intensity determination module 510 can receive the digital values from electron intensity determination circuit 503, and perform additional post-processing. The post-processing may include, for example, further summation of the digital values to generate an intensity value for the beam spot. Electron intensity determination circuit 503 may also perform post-processing to mitigate the effect of noise, such as detecting and excluding intensity output from a malfunctioning electron sensing element, detecting and excluding intensity output from electron sensing elements located in overlapping areas between neighboring beam spots, etc. Beam spot intensity determination module 510 may also perform other post-processing to mitigate the effect of noise, such as subtracting noise measurements from the intensity data. Beam spot boundary determination module 508 can determine the loci of the beam spots (e.g., based on the secondary boundaries), and provide the loci information of the beam spots, as well as the intensity values from beam spot intensity determination module 510, to image reconstruction module 512.

Image reconstruction module 512 can reconstruct an image of the wafer by combining the intensity values collected for a time window with the scan path data of the one or more primary electron beams during the time window. An image of the wafer under investigation can accordingly be acquired.

As shown in FIG. 5B, beam spot imaging circuit 504 can include buffer amplifiers 531a, . . . 531b, post-signal conditioning circuits 532a, . . . 532b, and analog to digital converters 533a, . . . 533b. Buffer amplifiers 531a, . . . 531b can be configured to transfer the scanned electronic signals transmitted from signal switch matrix 502h to post-signal conditioning circuits 532a, . . . 532b. Post-signal conditioning circuits 532a, . . . 532b can include variable gain amplifiers (VGA) and offset voltage generation circuits. The variable gain amplifiers can amplify the outputs signals from buffer amplifiers 531a, . . . 531b. The variable gain amplifier can modify the contrast of the reconstructed beam spot image. The offset voltage generation circuits can be configured to add an offset voltage to the amplified signal from the VGA to adjust the brightness of the reconstructed beam spot image. The amplifier gain and offset settings of post-signal conditioning circuits 532a, . . . 532b can be controlled by beam spot processing module 506. The analog to digital converters 533a, . . . 533b can be configured to convert the analog signals provided by post-signal conditioning circuits 532a, . . . 532b into a set of digital signals and provide the digital signals to beam spot imaging module 515.

Figure 6:
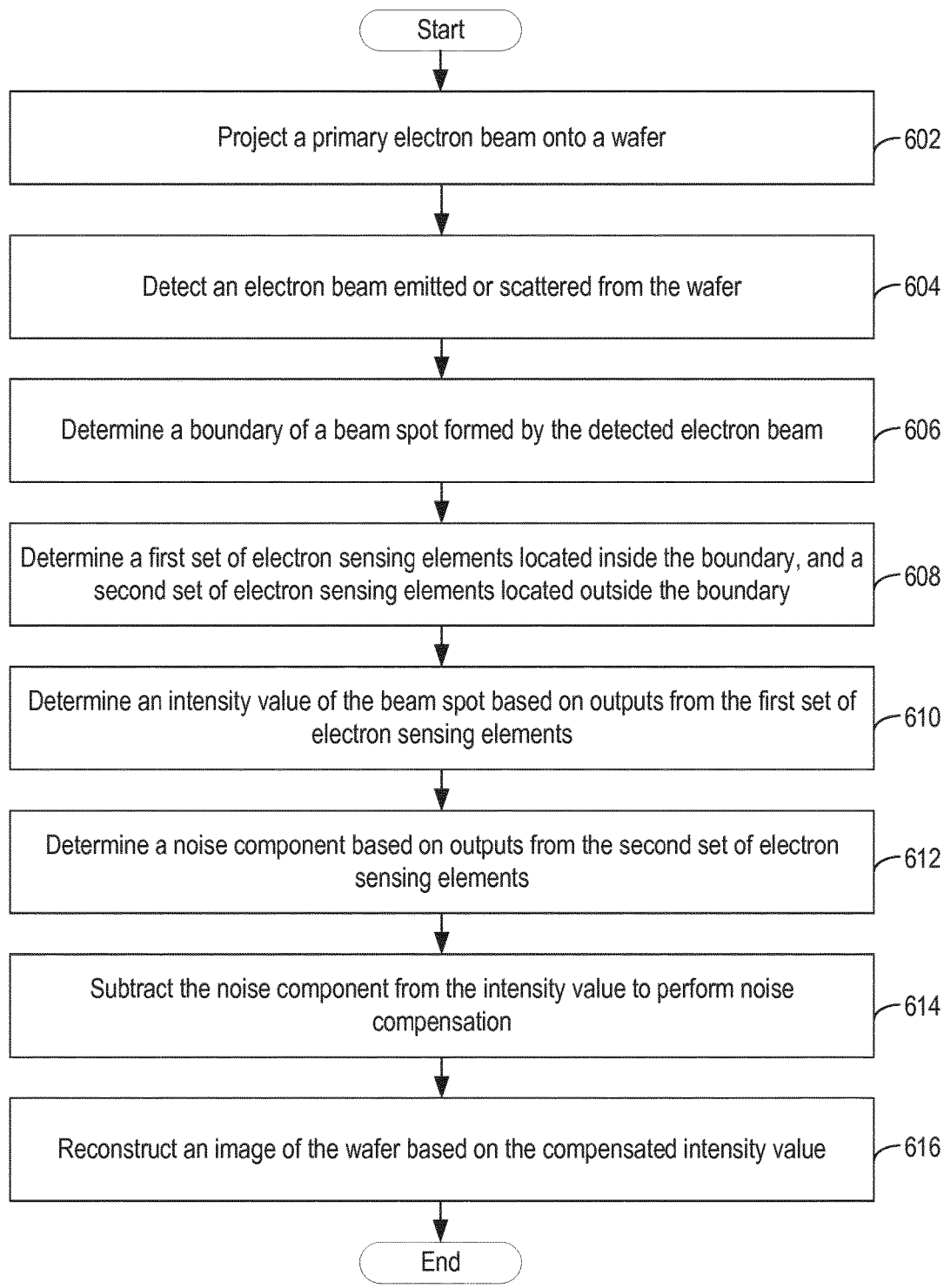
FIG. 6 is a flowchart illustrating an exemplary method for inspecting a wafer, consistent with embodiments of the present disclosure.

FIG. 6 is a flowchart representing an exemplary method 600 for inspecting a wafer. It will be readily appreciated that the illustrated procedure can be altered to delete steps or further include additional steps. Method 600 can be performed by, for example, electron beam tool 104 of FIG. 1 in conjunction with system 500 of FIG. 5A.

After an initial start, a primary electron beam (e.g., beamlets 214, 216, or 218) is projected onto a wafer (e.g., wafer 230), in step 602. The primary electron beam can be emitted by electron source 202. The primary electron beam is then guided by gun aperture 204, condenser lens 206, and source conversion unit 212 to form a plurality of beamlets of the primary electron beam. The one or more beamlets of primary electron beam are provided to primary projection optical system 220, which can focus the one or more beamlets onto wafer 230 and can direct secondary or backscattered electrons to an electron detector.

In step 604, the electron detector (e.g., electron detection device 244) can detect one or more electron beams comprising secondary or backscattered electrons (e.g., electron beams 236, 238, and 240), emitted or scattered by the wafer. The detector may include a plurality of electron sensing elements configured to generate signals based on a number of electrons received by the electron sensing elements within a predetermined period.

In step 606, beam spot boundary determination module 508 can determine a boundary of a beam spot formed by the electron beam detected in step 604. The determination of the boundary can be based on intensity gradient information of the beam spot provided by signal processing circuit 502.

In step 608, beam spot boundary determination module 508 can determine, based on the determined boundary, a first set of electron sensing elements located inside the boundary, and a second set of electron sensing elements located outside the boundary. The determination can be based on the locations of the sets of electron sensing elements on the sensor surface of electron detection device 244, and the location information of the boundary.

In step 610, electron intensity determination circuit 503 can determine an intensity value of the beam spot based on outputs from the first set of electron sensing elements. For example, the system can sum the outputs from the first set of electron sensing elements, perform brightness correction, perform contrast adjustments and convert the resulting analog sum signal into a digital signal.

In step 612, electron intensity determination circuit 503 can also determine a noise component based on outputs from the second set of electron sensing elements. For example, the system can obtain the outputs of electron sensing elements that are outside the boundary of the beam spot, but are within a predetermined distance from the boundary, as measurements for noise signals caused by interference sources located near the detector, etc.

In step 614, beam spot intensity determination module 510 can subtract the noise component from the intensity value, both of which can be provided by electron intensity determination circuit 503, to perform noise compensation. In some embodiments, electron intensity determination circuit 503 can use beam spot boundary determined in step 606 to eliminate cross-talk between adjacent beam spots, as described with reference to FIG. 4B. Beam spot intensity determination module 510 can subtract the cross-talk component from the intensity value, both of which can be provided by electron intensity determination circuit 503, to perform noise compensation, in step 614.

Based on the compensated electron intensity information, image reconstruction module 512 can reconstruct an image of a wafer, in step 616. Image reconstruction module 512 can reconstruct an image of the wafer by combining the intensity values provided by beam spot intensity determination module 510 for a time window along with the scan path data of the one or more primary electron beams during the time window.

Figure 7:
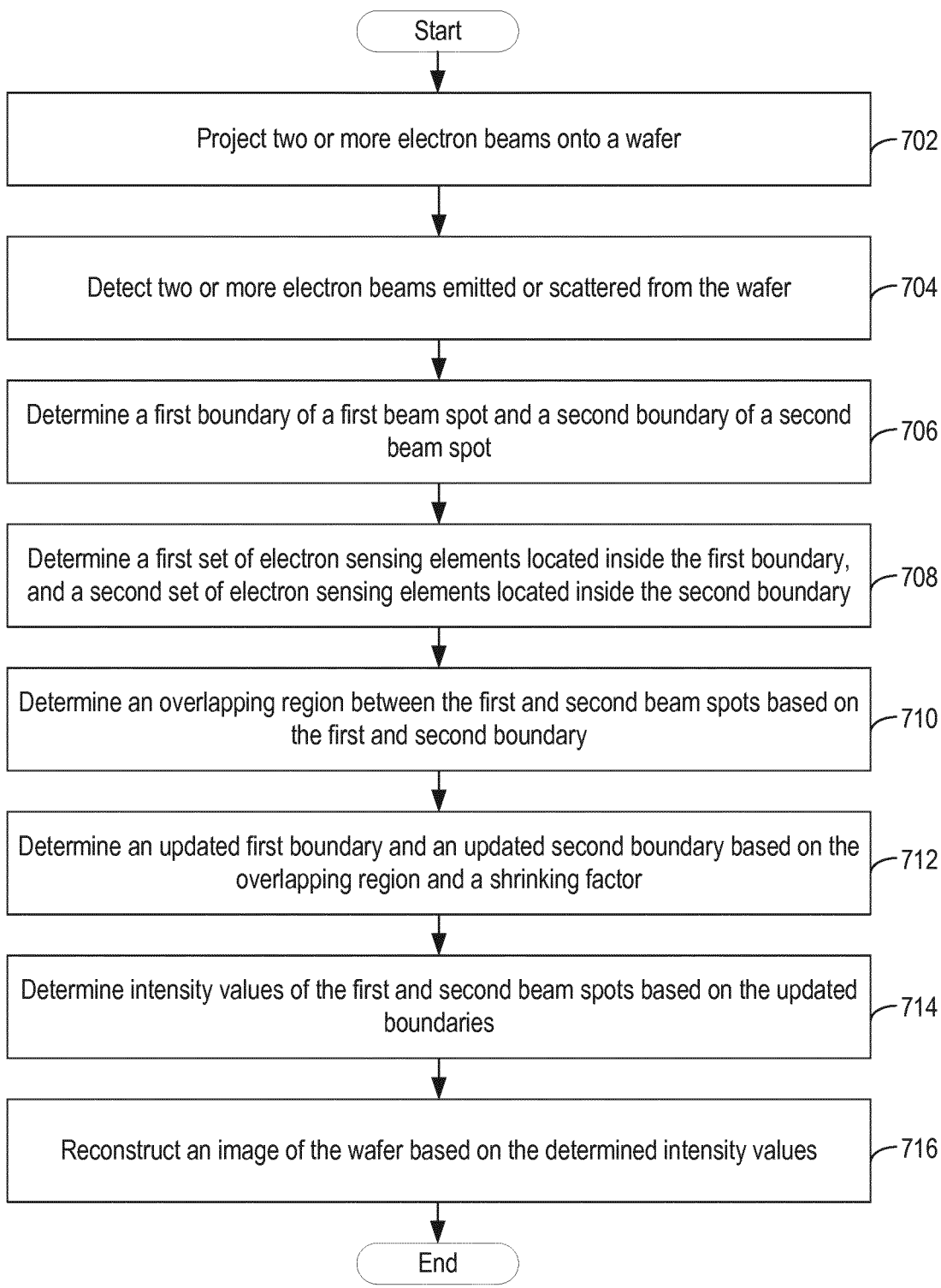
FIG. 7 is a flowchart illustrating an exemplary method for inspecting a wafer, consistent with embodiments of the present disclosure.

FIG. 7 is a flowchart representing an exemplary method 700 for inspecting a wafer with multiple beams. It will be readily appreciated that the illustrated procedure can be altered to delete steps or further include additional steps. Method 700 can be performed by, for example, electron beam tool 104 of FIG. 1 in conjunction with system 500 of FIG. 5A.

After an initial start, two or more beamlets of a primary electron beam (e.g., beamlets 214, 216, and/or 218) are projected onto a wafer (e.g., wafer 230), in step 702. The primary electron beam can be emitted by electron source 202. The primary electron beam is then guided by gun aperture 204, condenser lens 206, and source conversion unit 212 to form a plurality of beamlets of the primary electron beam. The two or more beamlets of the primary electron beam are provided to primary projection optical system 220, which can focus the two or more beamlets onto wafer 230 and can direct secondary or backscattered electrons to an electron detector.

In step 704, the electron detector (e.g., electron detection device 244) can detect multiple electron beams comprising secondary or backscattered electrons (e.g., secondary electron beams 236, 238, and 240) emitted or scattered by the wafer. The detector may include a plurality of electron sensing elements configured to generate signals based on a number of electrons received by the electron sensing elements within a predetermined period.

In step 706, beam spot boundary determination module 508 can determine a first boundary of a first beam spot and a second boundary of a second beam spot, formed by the electron beams detected in step 704. The determination of the boundaries can be based on intensity gradient information of the beam spots provided by signal processing circuit 502.

In step 708, beam spot boundary determination module 508 can determine, based on the determined boundaries, a first set of electron sensing elements located inside the first boundary, and a second set of electron sensing elements located inside the second boundary. The determination can be based on the locations of the sets of electron sensing elements on the sensor surface of electron detection device 244, and the location information of the boundary.

In step 710, beam spot processing module 506 can also determine an overlapping region between the first and second beam spots based on the electron sensing elements common to the first and second beam spots. Beam spot processing module 506 can, for example, detect an overlapping region 420 as described with reference to FIG. 4B. In some embodiments, beam spot processing module 506 can determine a third boundary that encloses a center of the first beam spot, a first distance between the third boundary and the first boundary, and a second distance between the third boundary and the second boundary. Beam spot processing module 506 can, for example, determine a first distance 412 and a second distance 414 with reference to FIG. 4B. In some embodiments, beam spot processing module 506 can determine a distance between the centers of the two beam spots based on the third and fourth boundaries. For example, beam spot processing module can determine a distance 416 between the centers of two beams spots, as described with reference to FIG. 4B. Beam spot processing module 506 can further determine an overlapping region if the determined distance between the centers falls below a predetermined threshold. For example, with reference to FIG. 4B, beam spot processing module 506 can determine an overlapping region 420 based on distance 416 being below a predetermined threshold.

Beam spot processing module 506 can mitigate the effects of overlapping regions by shrinking the boundaries of the beam spots. Beam spot processing module 506 can determine an updated first boundary and an updated second boundary, in step 712, based on the determined overlapping region. Beam spot processing module 506 can, for example, determine an updated first boundary 312ee and an updated second boundary 312ff with reference to FIG. 4B. The shrinking factor can be determined based on various considerations. In some embodiments, the shrinking factor can be based on a ratio between the first distance and the second distance between the centers determined in step 710. Further, excluding the outputs from the electron sensing elements in the determined overlapping region can reduce the determined intensity values of the beam spots. This reduction may reduce the intensity value relative to noise components (e.g., from dark current, interference sources, etc.), leading to a lower signal-to-noise ratio. With a reduced signal-to-noise, the intensity distribution generated from the beam spots may become more susceptible to the noise signals, which can degrade the fidelity of the image reconstruction. Therefore, in some embodiments, the shrinking factor can also be determined such that the resultant signal-to-noise ratio equals or exceeds a predetermined threshold.

In step 714, beam spot processing module 506 can determine the intensity values of the beam spots, based on the updated boundaries. This can reduce or eliminate the crosstalk between adjacent beam spots, as described with reference to FIG. 4B.

In step 716, beam spot processing module 506 can reconstruct an image of a wafer, based on the determined intensity values of the beam spots. Beam spot processing module 506 can reconstruct an image of the wafer by combining the intensity values provided by the electron sensing elements within the updated first and second boundaries.

The embodiments may further be described using the following clauses:

1. A detection system comprising:
   a signal processing circuit configured to generate a set of intensity gradients based on electron intensity data received from a plurality of electron sensing elements; and
   a beam spot processing module configured to:
   determine, based on the set of intensity gradients, at least one boundary of a beam spot; and
   determine, based on the at least one boundary, that a first set of electron sensing elements of the plurality of electron sensing elements is within the beam spot.

2. A detection system comprising:
   a beam spot processing module configured to:
   acquire a set of intensity signals from a plurality of electron sensing elements;
   determine, based on the set of intensity signals, at least one boundary of a beam spot; and
   determine, based on the at least one boundary, that a first set of electron sensing elements of the plurality of electron sensing elements is within the beam spot.

3. The detection system of clauses 1 or 2, wherein the beam spot processing module is further configured to:
   determine an intensity value of the beam spot based on electron intensity data received from the first set of electron sensing elements.

4. The detection system of clause 3, wherein the beam spot processing module is further configured to generate an image of a wafer based on the intensity value.

5. The detection system of any one of clauses 1, 3, and 4, wherein the signal processing circuit comprises an intensity gradient determination circuit configured to generate the set of intensity gradients.

6. The detection system of clause 5, wherein the intensity gradient determination circuit comprises a set of comparators configured to:
generate a set of comparison decisions based on comparisons of electron intensity data from adjacent electron sensing elements of the plurality of electron sensing elements, wherein the set of intensity gradients is determined based on the generated set of comparison decisions.
7. The detection system of any one of clauses 1-6, wherein the beam spot processing module comprises a beam spot boundary determination module configured to determine the at least one boundary of a beam spot.
8. The detection system of clause 7, wherein the plurality of electron sensing elements forms a sensor surface; and wherein the determination of the at least one boundary of a beam spot comprises the beam spot boundary determination module being further configured to:
associate the set of comparison decisions with a set of locations on the sensor surface;
determine a first location among the set of locations based on a predetermined pattern of the set of comparison decisions; and
determine that the first location is a part of the at least one boundary.
9. The detection system of clause 8, wherein the predetermined pattern comprises a first set of identical comparison decisions within a first region on the sensor surface and a second set of toggling comparison decisions within a second region on the sensor surface, wherein the beam spot boundary determination module is configured to determine the first location as a location between the first region and the second region.
10. The detection system of any one of clauses 1-9, wherein the beam spot processing module further comprises a beam spot intensity determination module configured to determine the intensity value of the beam spot.
11. The detection system of clause 10, wherein determination of the intensity value of the beam spot comprises the beam spot intensity determination module being further configured to:
determine, based on the at least one boundary, that a second set of electron sensing elements of the plurality of electron sensing elements is outside the beam spot;
determine a noise component based on electron intensity data received from the second set of electron sensing elements; and
determine a compensated intensity value based on a combination of the intensity value determined from the electron intensity data of the first set of electron sensing elements and the noise component,
wherein the beam spot processing module is configured to generate the image of the wafer based on the compensated intensity value.
12. The detection system of clause 11, wherein the determination of an intensity value of the beam spot comprises the beam spot intensity determination module being further configured to:
select one or more electron sensing elements from the second set of electron sensing elements based on a distance between the one or more electron sensing elements and the at least one boundary; and
determine a noise component based on electron intensity data received from the selected one or more electron sensing elements.
13. The detection system of any one of clauses 1-12, wherein the beam spot processing module further comprises an image reconstruction module configured to generate the image of the wafer based on the intensity value.
14. A detection system comprising:
a signal processing circuit configured to generate a set of intensity gradients based on electron intensity data received from a plurality of electron sensing elements; and
a beam spot processing module configured to:
determine, based on the set of intensity gradients, a first boundary of a first beam spot and a second boundary of a second beam spot;
determine, based on the first boundary, that a first set of electron sensing elements of the plurality of electron sensing elements is within the first beam spot;
determine, based on the second boundary, that a second set of electron sensing elements of the plurality of electron sensing elements is within the second beam spot; and
determine, based on the first and second boundary, an overlapping region between the first beam spot and the second beam spot.
15. A detection system comprising:
a beam spot processing module configured to:
acquire a set of intensity signals from a plurality of electron sensing elements;
determine, based on the set of intensity signals, a first boundary of a first beam spot and a second boundary of a second beam spot;
determine, based on the first boundary, that a first set of electron sensing elements of the plurality of electron sensing elements is within the first beam spot;
determine, based on the second boundary, that a second set of electron sensing elements of the plurality of electron sensing elements is within the second beam spot; and
determine, based on the first and second boundary, an overlapping region between the first beam spot and the second beam spot.
16. The detection system of clauses 14 or 15, wherein the beam spot processing module comprises a beam spot boundary determination module configured to determine the first and second boundary.
17. The detection system of any one of clauses 14-16, wherein a determination of an intensity value of at least one of the first beam spot and the second beam spot comprises the beam spot processing module being further configured to:
determine a third set of electron sensing elements of the plurality of electron sensing elements is within the overlapping region; and
determine a first intensity value of the first beam spot and a second intensity value of the second beam spot with electron intensity data received from the third set of electron sensing elements excluded.
18. The detection system of clause 17, wherein the beam spot processing module further comprises a beam spot intensity determination module configured to determine the first intensity value and the second intensity value.
19. The detection system of any one of clauses 14-18, wherein the beam spot processing module is further configured to determine, based on the overlapping region, at least one of an updated first boundary and an updated second boundary, wherein the beam spot processing module is configured to determine a first intensity value of the first beam spot or a second intensity value of the second beam spot based on the at least one of the updated first boundary and the updated second boundary.
20. The detection system of clause 19, wherein the determination of the at least one of the updated first boundary and the updated second boundary based on the overlapping region comprises the beam spot processing module being further configured to:
determine a third boundary that encloses a center of the first beam spot;
determine a first distance between the third boundary and the first boundary;
determine a second distance between third boundary and the second boundary;
determine a scaling factor based on the first distance and the second distance; and
determine the least one of the updated first boundary and the updated second boundary based on the scaling factor.
21. The detection system of clause 20, wherein the scaling factor is determined based on a predetermined signal-to-noise ratio threshold.
22. The detection system of any one of clauses 17-21, wherein the determination of the intensity value of the beam spot comprises the beam spot intensity determination module being further configured to:
determine that one or more electron sensing elements of the first set of electron sensing elements malfunction based on electron intensity data received from the one or more electron sensing elements; and
determine the intensity value of the beam spot with the electron intensity data received from the one or more electron sensing elements excluded.
23. The detection system of any one of clauses 14-22, further comprising an electron intensity determination circuit configured to:
generate a sum of electron intensity data received from the first set of electron sensing elements, and
generate a digital signal representing the sum;
wherein the beam spot intensity determination module is configured to determine an intensity value of the beam spot based on the digital signal.
24. The detection system of clause 23, wherein the electron intensity determination circuit further comprises:
a summing amplifier configured to output a summing signal representing the sum based on electron intensity data selected by a signal switch matrix, wherein the signal switch matrix is configured to select the electron intensity data of the first set of electron sensing elements based on the at least one boundary;
a post-signal conditioning circuit, comprising:
a variable gain amplifier configured to amplify the summing signal from the summing amplifier; and
an offset voltage generation circuit configured to add an offset voltage to the amplified signal from the variable gain amplifier; and
an analog-to-digital converter configured to generate the digital signal based on the signal from the post-signal conditioning circuit.
25. The detection system of any one of clauses 1-24, wherein the generation of an image of a wafer based on the intensity value comprises the image reconstruction module being further configured to:
obtain, from the beam spot intensity determination module, intensity values of a plurality of beam spots;
obtain, from the beam spot boundary determination module, loci of the plurality of beam spots;
map the loci to a plurality of scanned locations on or in the wafer; and
construct the image of the wafer based on the intensity values and the scanned locations.
26. The detection system of any one of clauses 1-25, further comprising a beam spot imaging circuit configured to:
receive a signal representing electron intensity data from one or more electron sensing elements scanned by the signal switch matrix;
generate a digital signal representing an amplitude of the signal; and
provide the digital signal to a beam spot imaging module, wherein the beam spot imaging module is configured to generate an image of the beam spots.
27. The detection system of any of clauses 1-26, further comprising a set of signal conditioning circuits configured to pre-process electron intensity data received from each of the plurality of electron sensing elements;
wherein the intensity gradient determination circuit is configured to determine the set of intensity gradients based on the pre-processed electron intensity data; and
wherein the beam spot intensity determination module is configured to determine the intensity value of the beam spot based on the pre-processed electron intensity data.
28. An electron detection system, comprising:
a plurality of electron sensing elements configured to receive at least one electron beam comprising backscattered electrons or secondary electrons from a wafer; and
a processing system comprising:
an intensity gradient determination circuit configured to determine a set of intensity gradients based on electron intensity data received from each of the plurality of electron sensing elements;
a beam spot boundary determination module configured to:
determine, based on the set of intensity gradients, at least one boundary of a beam spot of one of the at least one secondary electron beam, and
determine, based on the at least one boundary, that a first set of electron sensing elements of the plurality of electron sensing elements is within the beam spot; and
a beam spot intensity determination module configured to determine an intensity value of the beam spot based on the electron intensity data received from the first set of electron sensing elements; and
an image reconstruction module configured to generate an image of the wafer based on the intensity value.
29. The electron detection system of clause 28, wherein the intensity gradient determination circuit comprises a set of comparators configured to compare the electron intensity data received from a pair of neighboring electron sensing elements of the plurality of electron sensing elements;
wherein the set of intensity gradients is determined based on a set of comparison decisions by the set of comparators.
30. The electron detection system of clause 29, wherein the plurality of electron sensing elements forms a sensor surface; wherein the determination of at least one boundary of a beam spot comprises the beam spot boundary determination module being configured to:

associate the set of comparison decisions with a set of locations on the sensor surface;

determine a first location among the set of locations based on a predetermined pattern of the set of comparison decisions; and determine that the first location is a part of the at least one boundary.

31. The electron detection system of clause 30, wherein the predetermined pattern comprises a first set of identical comparison decisions within a first region on the sensor surface and a second set of toggling comparison decisions within a second region on the sensor surface, wherein the beam spot boundary determination module is configured to determine the first location as a location between the first region and the second region.

32. The electron detection system of any one of clauses 28-31, wherein the determination of an intensity value of the beam spot comprises the beam spot intensity determination module being further configured to:

determine, based on the at least one boundary, that a second set of electron sensing elements of the plurality of electron sensing elements is outside the beam spot;

determine a noise component based on the electron intensity data received from the second set of electron sensing elements; and determine a compensated intensity value based on a combination of the intensity value determined from the electron intensity data of the first set of electron sensing elements and the noise component, wherein the image reconstruction module is configured to generate the image of the wafer based on the compensated intensity value.

33. The electron detection system of clause 32, wherein the determination of an intensity value of the beam spot comprises the beam spot intensity determination module being further configured to:

select one or more electron sensing elements from the second set of electron sensing elements based on a distance between the one or more electron sensing elements and the at least one boundary; and determine a noise component based on the electron intensity data received from the selected one or more electron sensing elements.

34. The electron detection system of any one of clauses 28-33, wherein the determination of at least one boundary of a beam spot comprises the beam spot boundary determination module being configured to:

determine, based on the set of intensity gradients, a first boundary of a first beam spot and a second boundary of a second beam spot, and determine, based on the first and second boundary, an overlapping region between the first beam spot and the second beam spot.

35. The electron detection system of clause 34, wherein the determination of an intensity value of the beam spot comprises the beam spot intensity determination module being further configured to:

determine a third set of electron sensing elements of the plurality of electron sensing elements is within the overlapping region; and determine a first intensity value of the first beam spot and a second intensity value of the second beam spot with the electron intensity data received from the third set of electron sensing elements excluded.

36. The electron detection system of clauses 34 or 35, wherein the beam spot boundary determination module is further configured to determine an updated first boundary and an updated second boundary based on the overlapping region, wherein the beam spot intensity determination module is configured to determine a first intensity value of the first beam spot and a second intensity value of the second beam spot based on, respectively, the updated first boundary and the updated second boundary.

37. The electron detection system of clause 36, wherein the determination of an updated first boundary and an updated second boundary based on the overlapping region comprises the beam spot boundary determination module being further configured to:

determine a third boundary that encloses a center of the first beam spot;

determine a first distance between the third boundary and the first boundary;

determine a second distance between third boundary and the second boundary;

determine a scaling factor based on the first distance and the second distance; and determine the updated first boundary and the updated second boundary based on the scaling factor.

38. The electron detection system of clause 37, wherein the scaling factor is also determined based on a predetermined signal-to-noise ratio threshold.

39. The electron detection system of any of clauses 28-38, wherein the determination of an intensity value of the beam spot comprises the beam spot intensity determination module being further configured to:

determine that one or more electron sensing elements of the first set of electron sensing elements malfunction based on the electron intensity data received from the one or more electron sensing elements; and determine the intensity value of the beam spot with the electron intensity data received from the one or more electron sensing elements excluded.

40. The electron detection system of any of clauses 28-39, further comprising an electron intensity determination circuit configured to:

generate a sum of the electron intensity data received from the first set of electron sensing elements, and generate a digital signal representing the sum;

wherein the beam spot intensity determination module is configured to determine an intensity value of the beam spot based on the digital signal.

41. The electron detection system of clause 40, wherein the electron intensity determination circuit comprises:

a summing amplifier configured to output a summing signal representing the sum based on electron intensity data selected by a signal switch matrix, wherein the signal switch matrix is configured to select the electron intensity data of the first set of electron sensing elements based on the at least one boundary;

a post-signal conditioning circuit, comprising:

a variable gain amplifier configured to amplify the summing signal from the summing amplifier; and an offset voltage generation circuit configured to add an offset voltage to the amplified signal from the variable gain amplifier; and an analog-to-digital converter configured to generate the digital signal based on the signal from the post-signal conditioning circuit.

42. The electron detection system of any of clauses 28-41, wherein the generation of an image of a wafer based on the intensity value comprises the image reconstruction module being configured to:

obtain, from the beam spot intensity determination module, intensity values of a plurality of beam spots;
obtain, from the beam spot boundary determination module, loci of the plurality of beam spots;
map the loci to a plurality of scanned locations on or in the wafer; and
construct the image of the wafer based on the intensity values and the scanned locations.

43. The electron detection system of any of clauses 28-42, wherein the processing system further comprises a beam spot imaging circuit configured to:
receive a signal representing electron intensity data from one or more electron sensing elements scanned by the signal switch matrix;
generate a digital signal representing an amplification of the signal; and
provide the digital signal to a beam spot imaging module, wherein the beam spot imaging module is configured to generate an image of the beam spots.

44. The electron detection system of any of clauses 28-43, further comprising a set of signal conditioning circuits configured to pre-process the electron intensity data received from each of the plurality of electron sensing elements;
wherein the intensity gradient determination circuit is configured to determine the set of intensity gradients based on the pre-processed electron intensity data; and
wherein the beam spot intensity determination module is configured to determine the intensity value of the beam spot based on the pre-processed electron intensity data.

45. A method, comprising:
determining a set of intensity gradients based on electron intensity data received from each of a plurality of electron sensing elements; and
determining, based on the set of intensity gradients, at least one boundary of a beam spot.

46. The method of clause 45, further comprising:
determining, based on the at least one boundary, that a first set of electron sensing elements of the plurality of electron sensing elements is within the beam spot.

47. The method of clause 46, further comprising:
determining an intensity value of the beam spot based on the electron intensity data received from the first set of electron sensing elements.

48. The method of clause 47, further comprising: generating an image of a wafer based on the intensity value.

49. The method of any one of clauses 45-48, further comprising:
generating, by a set of signal level difference determination devices, a set of comparison decisions based on comparisons of the electron intensity data from adjacent electron sensing elements of the plurality of electron sensing elements, wherein the set of intensity gradients is determined based on the generated set of comparison decisions.

50. The method of clause 49, wherein the signal level difference determination devices include voltage comparators.

51. The method of clauses 49 or 50, wherein the plurality of electron sensing elements forms a sensor surface; wherein determining at least one boundary of a beam spot comprises:
associating the set of comparison decisions with a set of locations on the sensor surface;
determining a first location among the set of locations based on a predetermined pattern of the set of comparison decisions; and
determining that the first location is a part of the at least one boundary.

52. The method of clause 51, wherein the predetermined pattern comprises a first set of identical comparison decisions within a first region on the sensor surface and a second set of toggling comparison decisions within a second region on the sensor surface, wherein the first location is determined as a location between the first region and the second region.

53. The method of any one of clauses 47-52, wherein determining the intensity value of the beam spot further comprises:
determining, based on the at least one boundary, that a second set of electron sensing elements of the plurality of electron sensing elements is outside the beam spot;
determining a noise component based on the electron intensity data received from the second set of electron sensing elements; and
determining a compensated intensity value based on a combination of the intensity value determined from the electron intensity data of the first set of electron sensing elements and the noise component,
wherein the image of the wafer is generated based on the compensated intensity value.

54. The method of clause 53, wherein determining an intensity value of the beam spot comprises:
selecting one or more electron sensing elements from the second set of electron sensing elements based on a distance between the one or more electron sensing elements and the at least one boundary; and
determining a noise component based on the electron intensity data received from the selected one or more electron sensing elements.

55. A method, comprising:
determining a set of intensity gradients based on electron intensity data received from each of a plurality of electron sensing elements;
determining, based on the set of intensity gradients, a first boundary of a first beam spot and a second boundary of a second beam spot;
determining, based on the first boundary, that a first set of electron sensing elements of the plurality of electron sensing elements is within the first beam spot;
determining, based on the second boundary, that a second set of electron sensing elements of the plurality of electron sensing elements is within the second beam spot; and
determining, based on the first and second boundary, an overlapping region between the first beam spot and the second beam spot.

56. The method of clause 55, further comprising determining an intensity value of at least one of the first beam spot and the second beam spot, wherein the determination of the intensity value further comprises:
determining a third set of electron sensing elements of the plurality of electron sensing elements is within the overlapping region; and
determining a first intensity value of the first beam spot and a second intensity value of the second beam spot with the electron intensity data received from the third set of electron sensing elements excluded.

57. The method of clauses 55 or 56, further comprising:
determining an updated first boundary and an updated second boundary based on the overlapping region; and
determining a first intensity value of the first beam spot and a second intensity value of the second beam spot based on, respectively, the updated first boundary and the updated second boundary.
58. The method of clause 57, wherein determining an updated first boundary and an updated second boundary based on the overlapping region comprises:
determining a third boundary that encloses a center of the first beam spot;
determining a first distance between the third boundary and the first boundary;
determining a second distance between third boundary and the second boundary;
determining a scaling factor based on the first distance and the second distance; and
determining the updated first boundary and the updated second boundary based on the scaling factor.
59. The method of clause 58, wherein the scaling factor is also determined based on a predetermined signal-to-noise ratio threshold.
60. The method of any of clauses 47-59, wherein determining an intensity value of the beam spot comprises:
determining that one or more electron sensing elements of the first set of electron sensing elements malfunction based on the electron intensity data received from the one or more electron sensing elements; and
determining the intensity value of the beam spot with the electron intensity data received from the one or more electron sensing elements excluded.
61. The method of any of clauses 47-60, further comprising:
generating a sum of the electron intensity data received from the first set of electron sensing elements, and
generating a digital signal representing the sum;
wherein the intensity value of the beam spot is determined based on the digital signal.
62. The method of any of clauses 48-61, wherein generating an image of a wafer based on the intensity value comprises:
obtaining intensity values of a plurality of beam spots;
obtaining the loci of the plurality of beam spots;
mapping the loci to a plurality of scanned locations on or in the wafer; and
constructing the image of the wafer based on the intensity values and the scanned locations.
63. The method of clause 62, wherein the method further comprising:
receiving a signal representing electron intensity data scanned from one or more electron sensing elements;
amplifying the received signal;
generating a digital signal representing the amplified signal; and
generating an image of the beam spots based on the digital signal.
64. The method of any one of clauses 45-63, further comprising: pre-processing, with a set of signal conditioning circuits, the electron intensity data received from each of the plurality of electron sensing elements;
wherein the set of intensity gradients is determined based on the pre-processed electron intensity data; and
wherein the intensity value of the beam spot is determined based on the pre-processed electron intensity data.
65. A non-transitory computer readable storage medium storing instructions that are executable by a computing device that includes one or more processors to cause the computing device to perform a method comprising:
determining a set of intensity signals from a plurality of electron sensing elements; and
determining, based on the set of intensity signals, at least one boundary of a beam spot.
66. The medium of clause 65, wherein the method further comprising:
determining, based on the at least one boundary, that a first set of electron sensing elements of the plurality of electron sensing elements is within the beam spot.
67. The medium of clause 66, wherein the method further comprising:
determining an intensity value of the beam spot based on the electron intensity data received from the first set of electron sensing elements.
68. The medium of clause 67, wherein the method further comprising:
generating an image of a wafer based on the intensity value.
69. The medium of any one of clauses 65-68, wherein the method further comprising:
generating, by a set of signal level difference determination devices, a set of comparison decisions based on comparisons of the electron intensity data from a pair of adjacent electron sensing elements of the plurality of electron sensing elements, wherein the set of intensity gradients is determined based on the generated set of comparison decisions.
70. The medium of clause 69, wherein the signal level difference determination devices include voltage comparators.
71. The medium of clauses 69 or 70, wherein the plurality of electron sensing elements forms a sensor surface; wherein determining at least one boundary of a beam spot comprises:
associating the set of comparison decisions with a set of locations on the sensor surface;
determining a first location among the set of locations based on a predetermined pattern of the set of comparison decisions; and
determining that the first location is a part of the at least one boundary.
72. The medium of clause 71, wherein the predetermined pattern comprises a first set of identical comparison decisions within a first region on the sensor surface and a second set of toggling comparison decisions within a second region on the sensor surface, wherein a beam spot processing module is configured to determine the first location as a location between the first region and the second region.
73. The medium of any one of clauses 67-72, wherein determining an intensity value of the beam spot comprises:
determining, based on the at least one boundary, that a second set of electron sensing elements of the plurality of electron sensing elements is outside the beam spot;
determining a noise component based on the electron intensity data received from the second set of electron sensing elements; and
determining a compensated intensity value based on a combination of the intensity value determined from the electron intensity data of the first set of electron sensing elements and the noise component,
wherein the image of the wafer is generated based on the compensated intensity value.
74. The medium of clause 73, wherein determining an intensity value of the beam spot comprises:
selecting one or more electron sensing elements from the second set of electron sensing elements based on a distance between the one or more electron sensing elements and the at least one boundary; and determining a noise component based on the electron intensity data received from the selected one or more electron sensing elements.

75. A non-transitory computer readable storage medium storing instructions that are executable by a computing device that includes one or more processors to cause the computing device to perform a method comprising:

determining a set of intensity gradients based on electron intensity data received from each of a plurality of electron sensing elements;

determining, based on the set of intensity gradients, a first boundary of a first beam spot and a second boundary of a second beam spot;

determining, based on the first boundary, that a first set of electron sensing elements of the plurality of electron sensing elements is within the first beam spot;

determining, based on the second boundary, that a second set of electron sensing elements of the plurality of electron sensing elements is within the second beam spot; and determining, based on the first and second boundary, an overlapping region between the first beam spot and the second beam spot.

76. The medium of clause 75, wherein a determination of an intensity value of one or both of the first beam spot and the second beam spot comprises:

determining a third set of electron sensing elements of the plurality of electron sensing elements is within the overlapping region; and determining a first intensity value of the first beam spot and a second intensity value of the second beam spot with the electron intensity data received from the third set of electron sensing elements excluded.

77. The medium of clauses 75 or 76, wherein the method further comprising:

determining an updated first boundary and an updated second boundary based on the overlapping region; and determining a first intensity value of the first beam spot and a second intensity value of the second beam spot based on, respectively, the updated first boundary and the updated second boundary.

78. The medium of clause 77, wherein determining an updated first boundary and an updated second boundary based on the overlapping region comprises:

determining a third boundary that encloses a center of the first beam spot;

determining a first distance between the third boundary and the first boundary;

determining a second distance between third boundary and the second boundary;

determining a scaling factor based on the first distance and the second distance; and determining the updated first boundary and the updated second boundary based on the scaling factor.

79. The medium of clause 78, wherein the scaling factor is also determined based on a predetermined signal-to-noise ratio threshold.

80. The medium of any of clauses 67-79, wherein determining an intensity value of the beam spot comprises:

determining that one or more electron sensing elements of the first set of electron sensing elements malfunction based on the electron intensity data received from the one or more electron sensing elements; and determining the intensity value of the beam spot with the electron intensity data received from the one or more electron sensing elements excluded.

81. The medium of any of clauses 67-80, wherein the method further comprising:

generating a sum of the electron intensity data received from the first set of electron sensing elements, and generating a digital signal representing the sum;

wherein the intensity value of the beam spot is determined based on the digital signal.

82. The medium of any of clauses 68-81, wherein generating an image of a wafer based on the intensity value comprises:

obtaining intensity values of a plurality of beam spots;

obtaining the loci of the plurality of beam spots;

mapping the loci to a plurality of scanned locations on or in the wafer; and constructing the image of the wafer based on the intensity values and the scanned locations.

83. The medium of clause 82, wherein the method further comprising:

receiving a signal representing electron intensity data scanned from one or more electron sensing elements;

amplifying the received signal;

generating a digital signal representing the amplified signal; and generating an image of the beam spots based on the digital signal.

84. The medium of any of clauses 65-83, wherein the method further comprising: pre-processing, with a set of signal conditioning circuits, the electron intensity data received from each of the plurality of electron sensing elements;

wherein the set of intensity gradients is determined based on the pre-processed electron intensity data; and wherein the intensity value of the beam spot is determined based on the pre-processed electron intensity data.

85. A detector for receiving multiple charged particle beams, comprising:

a receiving surface with multiple sensing elements configured to generate a set of intensity signals based on a sensing of multiple charged particle beams; and a processing system configured to determine, based on the set of intensity signals, at least one boundary of a beam spot and to determine that a first set of sensing elements of the multiple sensing elements is within the beam spot.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A detection system comprising:

a signal processing circuit configured to generate a set of intensity gradients based on electron intensity data received from a plurality of electron sensing elements; and a beam spot processing module configured to:

determine, based on the set of intensity gradients, at least one boundary of a beam spot; and determine, based on the at least one boundary, that a first set of electron sensing elements of the plurality of electron sensing elements is within the beam spot.

2. A detection system comprising:
a beam spot processing module configured to:
acquire a set of intensity signals from a plurality of electron sensing elements;
determine, based on the set of intensity signals, at least one boundary of a beam spot; and
determine, based on the at least one boundary, that a first set of electron sensing elements of the plurality of electron sensing elements is within the beam spot.

3. The detection system of claim 1, wherein the beam spot processing module is further configured to:
determine an intensity value of the beam spot based on electron intensity data received from the first set of electron sensing elements.

4. The detection system of claim 3, wherein the beam spot processing module is further configured to generate an image of a wafer based on the intensity value.

5. The detection system of claim 1, wherein the signal processing circuit comprises an intensity gradient determination circuit configured to generate the set of intensity gradients.

6. The detection system of claim 5, wherein the intensity gradient determination circuit comprises a set of comparators configured to:
generate a set of comparison decisions based on comparisons of electron intensity data from adjacent electron sensing elements of the plurality of electron sensing elements, wherein the set of intensity gradients is determined based on the generated set of comparison decisions.

7. The detection system of claim 1, wherein the beam spot processing module comprises a beam spot boundary determination module configured to determine the at least one boundary of a beam spot.

8. The detection system of claim 7, wherein the plurality of electron sensing elements forms a sensor surface; and wherein the determination of the at least one boundary of a beam spot comprises the beam spot boundary determination module being further configured to:
associate the set of comparison decisions with a set of locations on the sensor surface;
determine a first location among the set of locations based on a predetermined pattern of the set of comparison decisions; and
determine that the first location is a part of the at least one boundary.

9. The detection system of claim 8, wherein the predetermined pattern comprises a first set of identical comparison decisions within a first region on the sensor surface and a second set of toggling comparison decisions within a second region on the sensor surface, wherein the beam spot boundary determination module is configured to determine the first location as a location between the first region and the second region.

10. The detection system of claim 1, wherein the beam spot processing module further comprises a beam spot intensity determination module configured to determine the intensity value of the beam spot.

11. The detection system of claim 10, wherein determination of the intensity value of the beam spot comprises the beam spot intensity determination module being further configured to:
determine, based on the at least one boundary, that a second set of electron sensing elements of the plurality of electron sensing elements is outside the beam spot;
determine a noise component based on electron intensity data received from the second set of electron sensing elements; and
determine a compensated intensity value based on a combination of the intensity value determined from the electron intensity data of the first set of electron sensing elements and the noise component,
wherein the beam spot processing module is configured to generate the image of the wafer based on the compensated intensity value.

12. The detection system of claim 11, wherein the determination of an intensity value of the beam spot comprises the beam spot intensity determination module being further configured to:
select one or more electron sensing elements from the second set of electron sensing elements based on a distance between the one or more electron sensing elements and the at least one boundary; and
determine a noise component based on electron intensity data received from the selected one or more electron sensing elements.

13. The detection system of claim 1, wherein the beam spot processing module further comprises an image reconstruction module configured to generate the image of the wafer based on the intensity value.

14. A detection system comprising:
a signal processing circuit configured to generate a set of intensity gradients based on electron intensity data received from a plurality of electron sensing elements; and
a beam spot processing module configured to:
determine, based on the set of intensity gradients, a first boundary of a first beam spot and a second boundary of a second beam spot;
determine, based on the first boundary, that a first set of electron sensing elements of the plurality of electron sensing elements is within the first beam spot;
determine, based on the second boundary, that a second set of electron sensing elements of the plurality of electron sensing elements is within the second beam spot; and
determine, based on the first and second boundary, an overlapping region between the first beam spot and the second beam spot.

15. A detection system comprising:
a beam spot processing module configured to:
acquire a set of intensity signals from a plurality of electron sensing elements;
determine, based on the set of intensity signals, a first boundary of a first beam spot and a second boundary of a second beam spot;
determine, based on the first boundary, that a first set of electron sensing elements of the plurality of electron sensing elements is within the first beam spot;
determine, based on the second boundary, that a second set of electron sensing elements of the plurality of electron sensing elements is within the second beam spot; and
determine, based on the first and second boundary, an overlapping region between the first beam spot and the second beam spot.

* * * * *